(12) United States Patent
Ishii et al.

(10) Patent No.: US 9,374,029 B2
(45) Date of Patent: Jun. 21, 2016

(54) MOTOR DRIVING CIRCUIT

(71) Applicant: ROHM CO., LTD., Kyoto (JP)

(72) Inventors: Hiroyuki Ishii, Kyoto (JP); Tatsuro Shimizu, Kyoto (JP)

(73) Assignee: ROHM CO., LTD. (JP)

( * ) Notice: Subject to any disclaimer, the term of this patent is extended or adjusted under 35 U.S.C. 154(b) by 142 days.

(21) Appl. No.: 14/193,123

(22) Filed: Feb. 28, 2014

(65) Prior Publication Data
US 2014/0177165 A1   Jun. 26, 2014

Related U.S. Application Data

(62) Division of application No. 13/071,626, filed on Mar. 25, 2011, now Pat. No. 8,704,470.

(30) Foreign Application Priority Data

Mar. 25, 2010   (JP) ................................ 2010-070664
Mar. 25, 2010   (JP) ................................ 2010-070668

(51) Int. Cl.
*H02K 29/08*   (2006.01)
*H02P 7/00*   (2016.01)
*H02P 7/29*   (2016.01)
(Continued)

(52) U.S. Cl.
CPC .. *H02P 7/00* (2013.01); *G06F 1/20* (2013.01); *H02P 7/29* (2013.01); *H03K 5/153* (2013.01)

(58) Field of Classification Search
USPC .................................................. 318/400.38
See application file for complete search history.

(56) References Cited

U.S. PATENT DOCUMENTS

| | | | | |
|---|---|---|---|---|
| 5,442,267 A | * | 8/1995 | Harada | ................. H02P 7/0066 318/280 |
| 8,040,087 B2 | * | 10/2011 | Hsu | ......................... H02P 6/16 318/400.01 |
| 2008/0252240 A1 | | 10/2008 | Sugie | |

(Continued)

FOREIGN PATENT DOCUMENTS

CN   101517884 A   8/2009
JP   1150496 U1   10/1989

(Continued)

OTHER PUBLICATIONS

Notification of Reasons for Refusal for Japanese Patent Application No. 2010-070664, dated Mar. 4, 2014 with English Translation.

(Continued)

*Primary Examiner* — Eduardo Colon Santana
*Assistant Examiner* — Bickey Dhakal
(74) *Attorney, Agent, or Firm* — Cantor Colburn LLP

(57) ABSTRACT

A motor driving circuit may include a timing detection circuit configured to receive a signal that corresponds to the Hall signal output from the Hall sensor, and to generate a timing signal which is asserted at a predetermined timing in every cycle of the Hall signal. The timing detection circuit may include a counter configured to perform a counting operation according to a clock signal; a reset unit configured to reset a count value of the counter for every cycle of the counter, to a value obtained by multiplying the count value obtained immediately before the reset operation by a negative coefficient; and a comparison unit configured to assert the timing signal at every timing at which there is a zero-crossing in the value of the counter.

9 Claims, 14 Drawing Sheets

(51) Int. Cl.
*G06F 1/20* (2006.01)
*H03K 5/153* (2006.01)

(56) References Cited

U.S. PATENT DOCUMENTS

| | | | |
|---|---|---|---|
| 2009/0290669 A1* | 11/2009 | Sato | G01D 5/204 |
| | | | 375/359 |
| 2011/0234129 A1 | 9/2011 | Shimizu et al. | |
| 2011/0279072 A1 | 11/2011 | Shimizu et al. | |
| 2011/0292226 A1 | 12/2011 | Shimizu | |
| 2012/0250385 A1 | 10/2012 | Takihara et al. | |

FOREIGN PATENT DOCUMENTS

| | | | |
|---|---|---|---|
| JP | 03263910 | A | 11/1991 |
| JP | 07053438 | Y2 | 12/1995 |
| JP | 2000165204 | A | 6/2000 |
| JP | 2004-166429 | A | 6/2004 |
| JP | 2005-224100 | A | 8/2005 |
| JP | 2007043890 | A | 2/2007 |
| JP | 2007532033 | A | 8/2007 |
| JP | 2008312328 | A | 12/2008 |
| JP | 2008312329 | A | 12/2008 |
| TW | 200845560 | A | 11/2008 |
| TW | 200934092 | A | 8/2009 |
| WO | 2005011181 | A2 | 2/2005 |

OTHER PUBLICATIONS

Taiwanese Office Action corresponding to Patent Application No. 100110497; Date of Mailing: Jul. 6, 2015, with English translation.

* cited by examiner

MOTOR DRIVING CIRCUIT

The present application is a divisional application of U.S. patent application Ser. No. 13/071,626, filed on Mar. 25, 2011, the entire contents of which are incorporated herein by reference. The 13/071,626 application claimed the benefit of the date of the earlier filed Japanese Patent Application Nos. JP 2010-070664 and JP 2010-070668, both filed Mar. 25, 2010, priority to which are also claimed herein, and the contents of which are also incorporated by reference herein.

BACKGROUND OF THE INVENTION

1. Field of the Invention

The present invention relates to a motor driving apparatus.

2. Description of the Related Art

In recent years, increase in the operation speed of personal computers and workstations has led to rapid increase in the operation speeds of computation LSIs (large Scale Integrated Circuit) such as CPUs (Central Processing Unit), DSPs (Digital Signal Processor), etc.

Such LSIs have a problem in that an increase in the operation speed, i.e., an increase in clock frequency involves an increase in heat generation. The heat generation of the LSI leads to thermal runaway of the LSI itself, or affects its peripheral circuits, which becomes a problem. Accordingly, such a situation requires a suitable thermal cooling operation for the LSI, as a crucial technique.

Examples of techniques for cooling an LSI includes an air-cooling cooling method employing a cooling fan. In this method, for example, a cooling fan is arranged such that it faces the surface of the LSI, and cool air is blown onto the surface of the LSI using the cooling fan. In the cooling operation of such a cooling fan, the temperature is monitored in the vicinity of the LSI, and the rotational speed of the fan is changed according to the temperature thus monitored (Patent document 2).

RELATED ART DOCUMENTS

Patent Documents

[Patent Document 1]
  Japanese Patent Application Laid Open No. 2005-224100
[Patent Document 2]
  Japanese Patent Application Laid Open No. 2004-166429

1. In some cases, the thermal generation of such an LSI, the temperature thereof, the threshold temperature of thermal runaway, and so on, differ with each particular LSI. Accordingly, it is preferable that the rotational speed of the cooling fan can be set in a flexible manner according to such a particular LSI to be cooled.

2. In a case in which the fan motor is driven according to a Hall signal output from a Hall sensor, such an arrangement requires the peak value or the bottom value of the Hall signal for every cycle in order to detect the amplitude of the Hall signal or in order to detect the offset of the Hall signal. In this case, a timing signal which is asserted at a predetermined timing that corresponds to the peak or the bottom of the Hall signal for every cycle is required.

SUMMARY OF THE INVENTION

1. The present invention has been made in view of such a situation. Accordingly, it is an exemplary purpose of the present invention to provide a fan motor driving apparatus and a cooling apparatus configured to set the rotational speed of a cooling fan motor in a flexible manner according to the temperature, and to provide a desired level of cooling of a cooling target.

2. Also, the present invention has been made in view of such a situation. Accordingly, it is an exemplary purpose of the present invention to provide a timing detection circuit configured to detect a desired timing in the cycle of the cyclic signal such as a Hall signal or the like.

1. An embodiment of the present invention relates to a motor driving circuit configured to receive a Hall signal, which comprises a first signal and a second signal that are complementary, from a Hall sensor, and to PWM (Pulse Width Modulation) drive a motor. The motor driving circuit comprises: a control instruction combining circuit configured to generate a duty ratio control signal which indicates a duty ratio for the PWM driving operation based upon first digital data which indicates the duty ratio for the PWM driving operation and second digital data which indicates the temperature; a pulse modulator configured to convert the duty ratio control signal into a pulse control signal having the duty ratio indicated by the duty ratio control signal; and a driver circuit configured to drive the fan motor based upon the pulse control signal. The control instruction combining circuit comprises: a first calculation unit configured to subtract third digital data which indicates the minimum value of the duty ratio from the first digital data; a slope calculation unit configured to generate temperature-dependent slope data based upon the second digital data; a second calculation unit configured to multiply the slope data by the output data of the first calculation unit; a third calculation unit configured to sum the output data of the second calculation unit and the third digital data; and a selector configured to receive the output data of the third calculation unit and the third digital data, to select data that corresponds to the sign of the output data of the first calculation unit, and to output the data thus selected as the duty ratio control signal.

Such an embodiment is capable of independently setting the minimum rotational speed of the fan motor and the temperature dependence of the rotational speed.

Also, a motor driving circuit according to an embodiment may further comprise: a terminal configured to receive, from an external circuit, an external pulse modulation signal subjected to pulse modulation; and an instruction logic conversion circuit configured to receive the external pulse modulation signal, and to convert the external pulse modulation signal into the first digital data having a digital value that corresponds to the duty ratio of the external pulse modulation signal.

Also, the instruction logic conversion circuit may comprise: a level conversion circuit configured to multiply the external pulse modulation signal converted into a 1/0 binary signal by a coefficient 2L (L represents an integer); and a digital low-pass filter configured to perform filtering of the output data of the level conversion circuit so as to output the first digital data.

With such an embodiment, the external pulse modulation signal can be converted into the first digital data using the digital signal processing.

Also, the digital low-pass filter may be configured as a first-order IIR (Infinite Impulse Response) low-pass filter, comprising a fourth calculation unit, a delay circuit, and a fifth calculation unit, sequentially connected in series. Also, the fourth calculation unit may be configured to sum the output data of the level conversion circuit and the output data of the delay circuit, and to subtract the output data of the fifth calculation unit from the sum result. Also, the delay circuit may be configured to delay the output data of the fourth calculation unit. Also, the fifth calculation unit may be configured to multiply the output data of the delay circuit by a coefficient $2^{-n}$ (n represents an integer).

Also, n may be set such that the ripple width of the output data of the fifth calculation unit is 1 or less.

Also, the delay circuit may delay the output data of the fourth calculation unit by $T_{CLK}$ in synchronization with a clock signal having the period $T_{CLK}$.

Also, with the frequency of the external pulse modulation signal as $f_{PWM}$, the frequency $f_{CLK}$ of the clock signal may be determined so as to satisfy a relation $f_{CLK} \geq 2L \times f_{PWM}$.

Such an arrangement is capable of generating at least one first digital data for every cycle without missing any pulses of the external pulse modulation signal.

Another embodiment of the present invention relates to a cooling apparatus. The cooling apparatus comprises: a fan motor; and a driving circuit according to any one of the aforementioned embodiments, configured to drive the fan motor.

Yet another embodiment of the present invention relates to an electronic device. The electronic device comprises: a processor; and a cooling apparatus according to any one of the aforementioned embodiments, configured to cool the processor.

2. Yet another embodiment of the present invention relates to a timing detection circuit configured to receive a signal that corresponds to a Hall signal output from a Hall sensor, and to generate a timing signal which is asserted at a predetermined timing in every cycle of the Hall signal. The timing detection circuit comprises: a counter configured to perform a counting operation according to a clock signal; a reset unit configured to reset the count value of the counter for every cycle of the counter, to a value obtained by multiplying the count value obtained immediately before the reset operation by a negative coefficient; and a comparison unit configured to assert the timing signal at every timing at which there is a zero-crossing in the value of the counter.

With such an embodiment, by setting such a negative coefficient according to a desired timing, such an arrangement is capable of generating a timing signal which is asserted at the desired timing.

Also, the negative coefficient may be set to −½, and the predetermined timing may be set at a timing that is ⅓ the period of the Hall signal. The peak and the bottom of the Hall signal occur in a range between the ⅓ and ⅔ time points in the period of the Hall signal. Thus, such a timing is suitably used to detect the amplitude or the offset amount of the Hall signal.

Also, when the value of the counter reaches a predetermined threshold value, the comparison unit may assert an abnormality detection signal which indicates an abnormal stoppage of a motor. Such an arrangement allows the timing detection circuit to also function as an abnormality detection circuit, thereby providing a reduced circuit area.

Yet another embodiment of the present invention relates to a motor driving circuit configured to receive a Hall signal, which comprises a first signal and a second signal that are complementary, from a Hall sensor, and to drive a motor. The motor driving circuit comprises: a first A/D converter and a second A/D converter respectively configured to perform analog/digital conversion of the first signal and the second signal of the Hall signal so as to generate a third signal and a fourth signal in the form of digital signals; a differential conversion circuit configured to generate a fifth signal in the form of a single-ended signal that corresponds to the difference between the third signal and the fourth signal; an offset correction circuit configured to correct offset of the fifth signal so as to generate a sixth signal; an amplitude control circuit configured to stabilize the amplitude of the sixth signal to a predetermined target value, and to generate the absolute value of the resulting value, so as to generate a seventh signal; a control signal generating unit configured to generate a control signal based upon the seventh signal; a driver circuit configured to drive the motor according to the control signal; and a timing detection circuit configured to receive a signal that corresponds to the fifth signal, and to generate the timing signal. The amplitude control circuit sets the value of the seventh signal for the amplitude of the seventh signal at a timing at which the timing signal is asserted.

Yet another embodiment of the present invention relates to a cooling apparatus. The cooling apparatus comprises: a fan motor; and a driving circuit according to any one of the aforementioned embodiments, configured to drive the fan motor.

Yet another embodiment of the present invention relates to an electronic device. The electronic device comprises: a processor; and a cooling apparatus according to any one of the aforementioned embodiments, configured to cool the processor.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

[First Embodiment]

Figure 1:
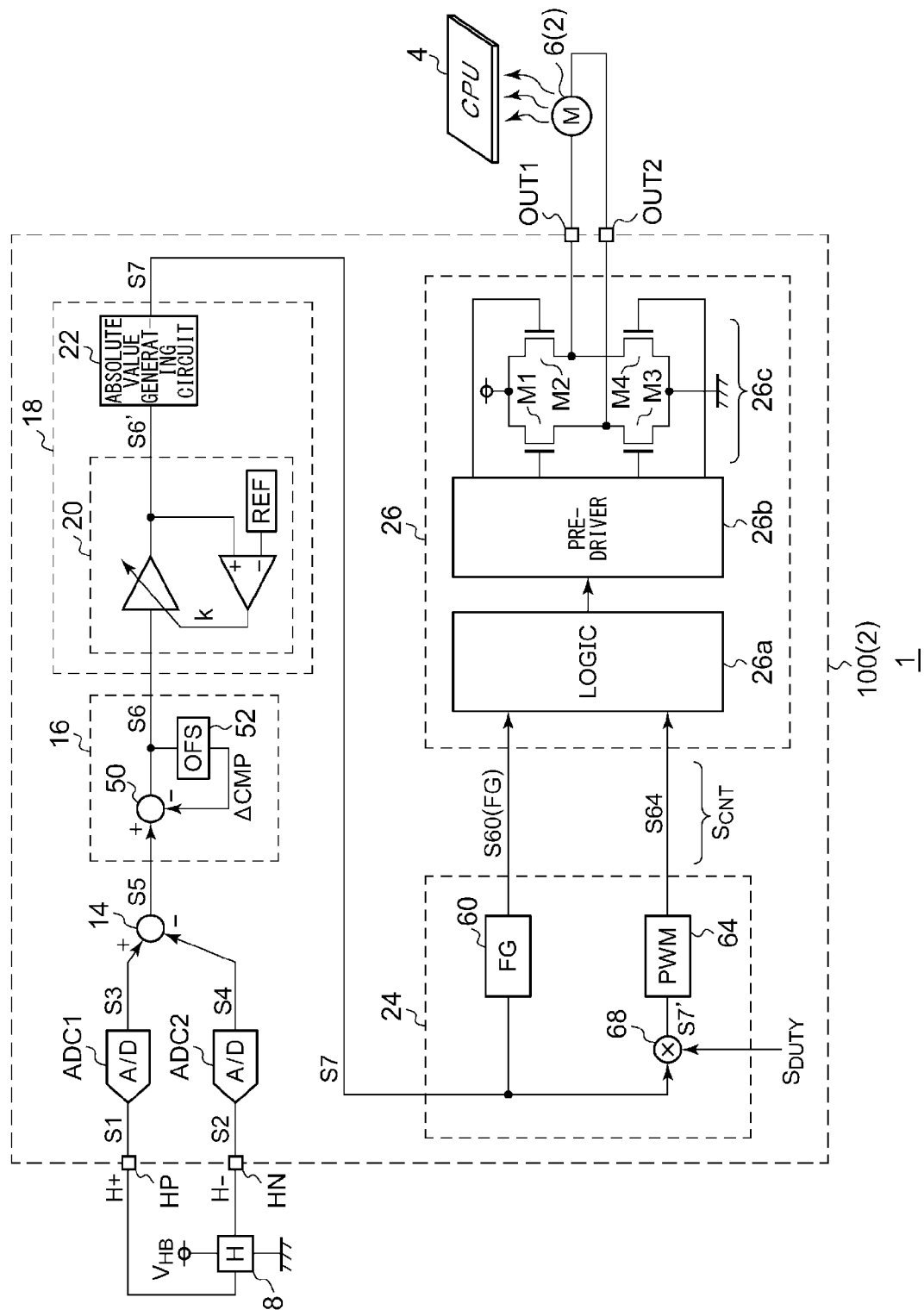
FIG. 1 is a circuit diagram which shows a configuration of a cooling apparatus including a driving IC according to an embodiment.

FIG. 1 is a circuit diagram which shows a configuration of an electronic device 1 including a driving IC 100 according to an embodiment. The electronic device 1 is configured as a desktop computer, a laptop computer, a workstation, a game device, an audio device, a video device, or the like, for example, and includes a cooling apparatus 2 and a CPU (Central Processing Unit) 4. The cooling apparatus 2 includes a fan motor 6 arranged such that it faces the CPU 4, and a driving IC 100 configured to drive the fan motor 6.

The driving IC 100 is configured as a function IC integrated on a single semiconductor chip. The driving IC 100 is connected to a Hall sensor 8 arranged at a position at which it receives the magnetic field from the rotor of the fan motor 6, in addition to being connected to the fan motor 6 to be driven. A Hall bias voltage $V_{HB}$ is applied to the Hall sensor 8. The Hall sensor 8 generates a Hall signal comprising a complimentary first signal S1 (H+) and second signal S2 (H−) according to the position of the rotor of the fan motor 6. The Hall sensor 8 may be configured as a built-in component of the driving IC 100.

The driving IC 100 includes a first A/D converter ADC1, a second A/D converter ADC2, a differential conversion circuit 14, an offset correction circuit 16, an amplitude control circuit 18, a control signal generating unit 24, and a driver circuit 26.

The driving IC 100 receives the first signal S1 and the second signal S2 from the Hall sensor 8 via Hall input terminals HP and HN, respectively. The first A/D converter ADC1 and the second A/D converter ADC2 respectively perform analog/digital conversion of the first signal S1 and the second signal S2 of the Hall signal, so as to generate a third signal S3 ($S_{HP}$) and a fourth signal S4 ($S_{HN}$) in the form of digital signals.

The downstream signals of the first A/D converter ADC1 and the second A/D converter ADC2 are each configured as 8-bit binary data, for example. The differential conversion circuit 14 generates a single-ended fifth signal S5 according to the difference between the third signal S3 and the fourth signal S4. The differential conversion circuit 14 is configured as a digital subtractor.

In a case in which there is no offset of the Hall signal H+ and H−, the fifth signal S5 has a waveform which repeatedly alternates between a positive state and a negative state with the zero point as the center. However, if there is such an offset, the fifth signal S5 has a waveform that swings with the offset value as the center, leading to adverse effects on the downstream operation. Specifically, this leads to a problem in that each switching timing at which the driving phase of the fan motor 6 is to be switched cannot be detected normally, and a problem in that each period for which a soft switch driving operation is to be performed in order to switch the phase cannot be detected normally. In order to solve such a problem, the offset correction circuit 16 performs digital signal processing so as to correct the offset of the fifth signal S5, thereby generating a sixth signal S6.

Figure 2:
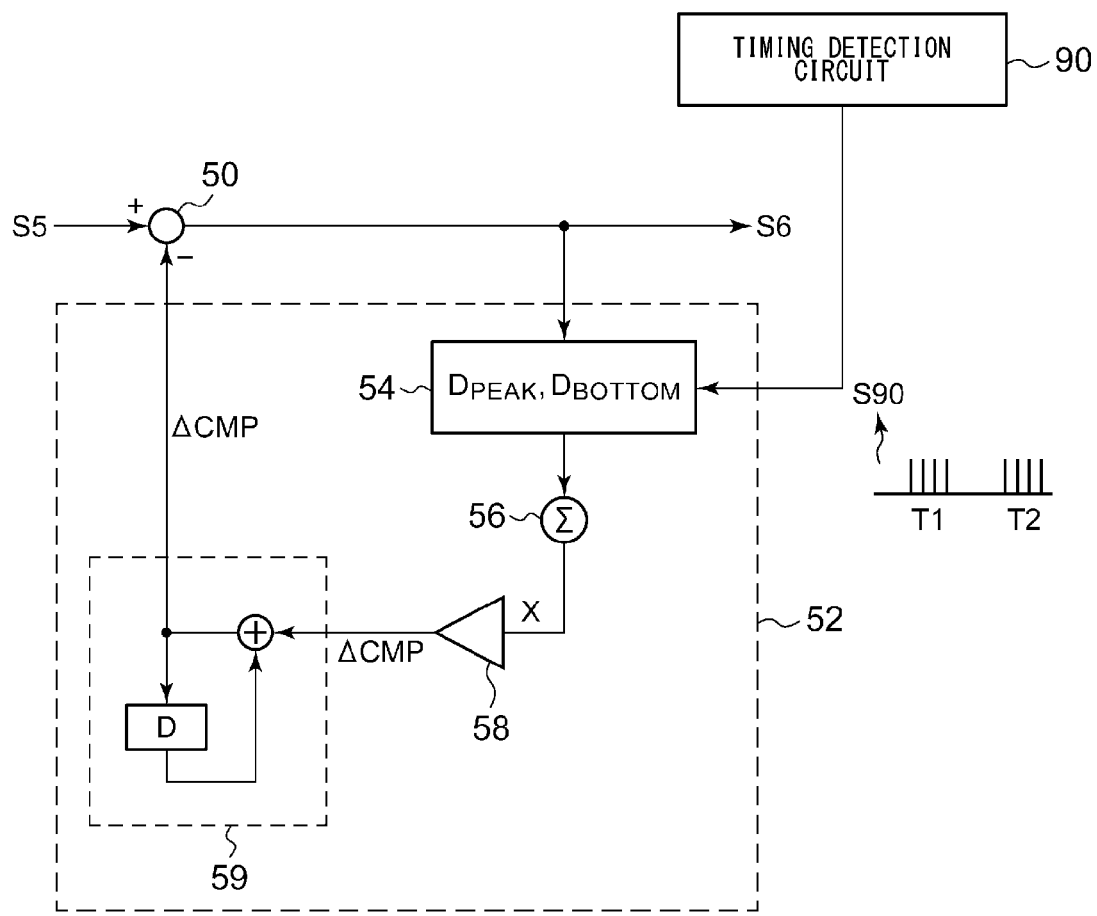
FIG. 2 is a circuit diagram which shows a configuration of an offset correction circuit.

FIG. 2 is a circuit diagram which shows a configuration of the offset correction circuit 16. The offset correction circuit 16 includes an offset correction circuit 50 and an offset amount control unit 52. The offset correction circuit 50 is configured as a digital adder/subtractor, and is configured to shift the fifth signal S5 by summing the fifth signal S5 and a correction amount ΔCMP or by subtracting the correction amount ΔCMP from the fifth signal S5, and outputs the resulting signal as the sixth signal S6. The offset amount control unit 52 generates data that indicates the correction amount ΔCMP based upon the sixth signal S6.

Figure 3:
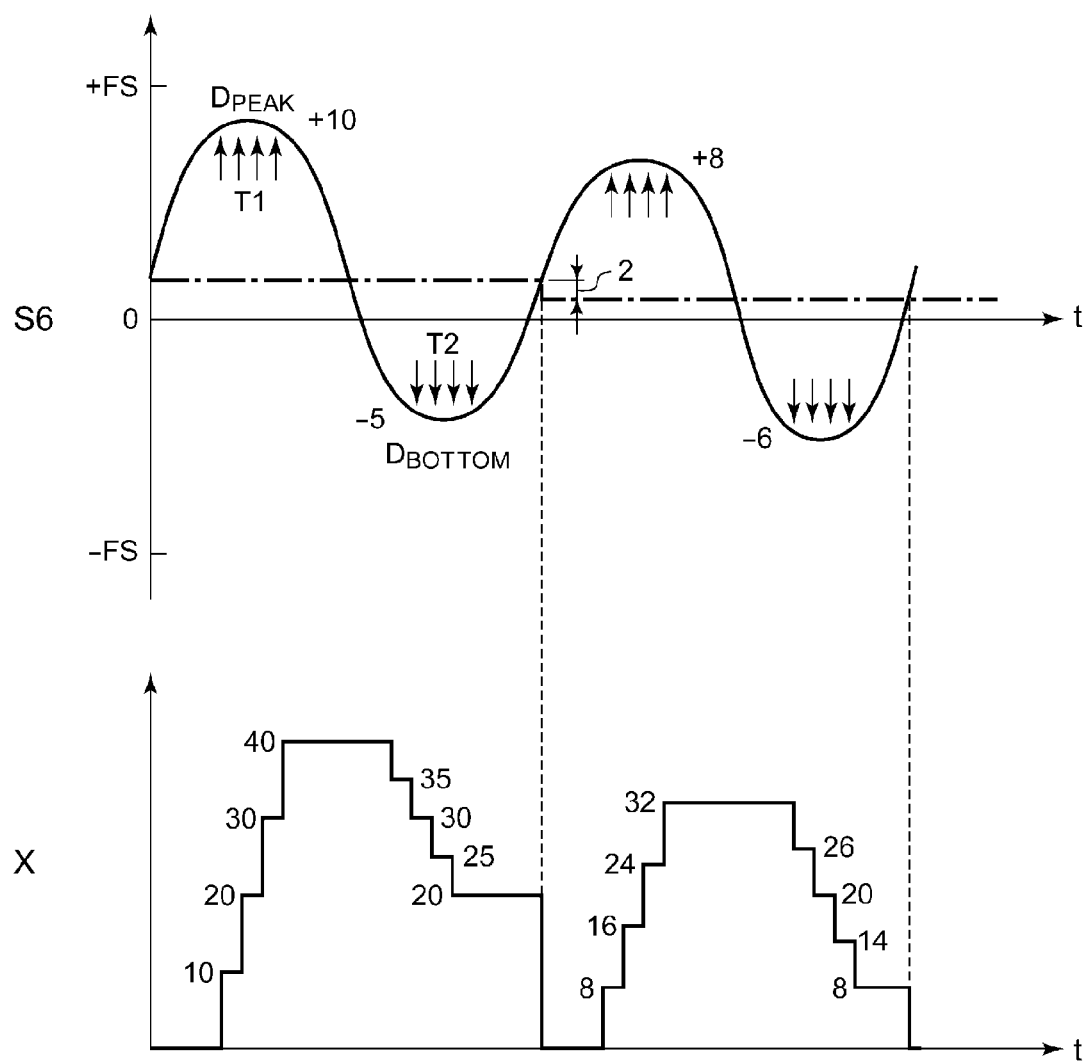
FIG. 3 is a waveform diagram which shows the operation of the offset correction circuit.

FIG. 3 is a waveform diagram which shows an operation of the offset correction circuit 16. FIG. 2 shows a sixth signal S6 when such an offset has not been completely canceled out. A sampling unit 54 included in the offset amount control unit 52 performs data sampling of a value $D_{PEAK}$ at a timing T1 in the vicinity of the peak of the sixth signal S6, and performs data sampling of a value $D_{BOTTOM}$ at a timing T2 in the vicinity of the bottom of the sixth signal S6. Such a sampling operation is performed at least once for every peak and every bottom of the sixth signal S6. With the offset correction circuit 16 shown in FIG. 1, data sampling is performed multiple times, e.g., four times, for every peak and every bottom of the sixth signal S6. A timing detection circuit 90 detects a timing at which the sampling unit 54 is to perform a sampling operation, and outputs a timing control signal S90 which indicates the timings T1 and T2 thereof.

The cycle of the Hall signal H+ and H− changes over time according to the rotational speed of the fan motor 6. Accordingly, in an operation for acquiring the amplitude of the Hall signal H+ and H−, the timings T1 and T2 of the occurrence of the peak and the bottom of the sixth signal S6 change according to the rotational speed. Accordingly, the timing detection circuit 90 is required to have a function for detecting the timings T1 and T2 according to the rotational speed.

For example, the timing detection circuit 90 may include a counter, a calculation unit, a latch circuit, and a comparator. The counter measures the period of the fifth signal, the period of the sixth signal that corresponds to the fifth signal, or the period of the seventh signal. The calculation unit multiples the count value that corresponds to the period thus measured by a coefficient that corresponds to a desired timing, and instructs the latch circuit to store the value thus calculated. The comparator may assert a timing signal every time the count value of the counter reaches the value held by the latch circuit.

The offset amount control unit 52 determines the correction amount ΔCMP based upon the peak values $D_{PEAK}$ and the bottom values $D_{BOTTOM}$ thus sampled. Specifically, the integrator 56 is configured to sequentially sum the peak values $D_{PEAK}$ and the bottom values $D_{BOTTOM}$. The correction amount determining unit 58 outputs a correction amount ΔCMP that corresponds to the sum result X. For example, the correction amount determining unit 58 determines the correction amount ΔCMP as a value obtained by multiplying the sum result X by a predetermined coefficient, e.g., a gain G=1/10. In a case in which the predetermined coefficient is set to $2^n$, the correction amount determining unit 58 may be configured as a bit shifter circuit.

The integrator 59 integrates the correction amount ΔCMP, and outputs the resulting value to the offset correction circuit 50.

The offset correction circuit 16 calculates the offset of the input signal S5, and has a feedback loop configured to subtract the offset thus calculated such that the offset of the output signal becomes zero. An integrator 59 having an integrating function is included in the feedback loop. The offset calculation is executed once per cycle of the electrical angle of the Hall sensor. Accordingly, the cycle of the electrical angle of the Hall sensor matches the sampling frequency at which the integrator 59 operates. The offset correction circuit 16 demonstrates the characteristics of a high-pass filter.

If the offset of the Hall signal is zero, the sum total X of the data thus sampled is zero. In a case in which there is a positive offset of the Hall signal H+ and H−, the sum total X results in a positive value. In a case in which there is a negative offset of the Hall signal H+ and H−, the sum total X results in a negative value.

For example, let us consider a case in which there is a positive offset of the Hall signal H+ and H−. In this case, let us say that the peak value has been sampled four times, with the peak values being $D_{PEAK}$ 10, 10, 10, and 10, and that the bottom value has been sampled four times, with the bottom values being $D_{BOTTOM}$ −5, −5, −5, and −5. In this case, the data sum total X is 10×4−5×4=20. Thus, the correction amount ΔCOMP is represented by a value obtained by multiplying the sum total 20 by 1/10, i.e., 2. The offset correction circuit 50 subtracts the correction amount ΔCOMP=2 from the fifth signal S5. The output X of the integrator 56 is reset for every cycle of the Hall signal.

The offset correction circuit 16 repeatedly performs such an operation for every cycle of the Hall signal, thereby providing an offset-free sixth signal S6 with zero as the center.

Returning to FIG. 1, the amplitude control circuit 18 stabilizes the amplitude of the sixth signal S6 to a predetermined target value REF, and generates the absolute value thereof so as to generate a seventh signal S7. FIG. 1 shows an arrangement in which an amplitude correction circuit 20 configured to stabilize the amplitude and an absolute value generating circuit 22 configured to generate the absolute value are connected in series in this order. The order of the amplitude stabilization operation and the absolute value generating operation is not restricted in particular. Accordingly, the absolute value generating circuit 22 may be arranged upstream of the amplitude correction circuit 20.

Figure 4A:
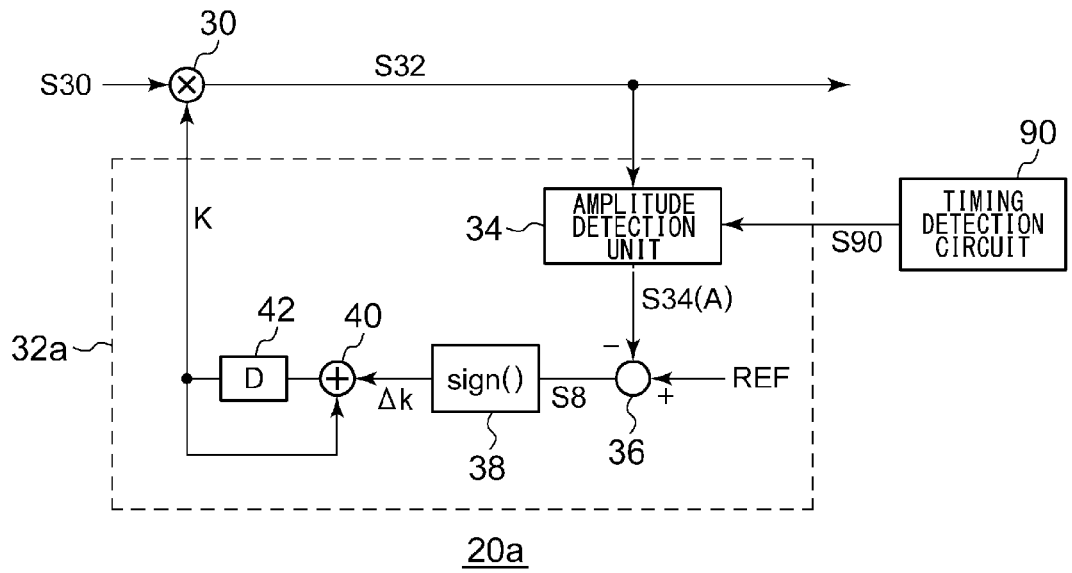
FIGS. 4A and 4B are circuit diagrams each showing an example configuration of an amplitude correction circuit shown in FIG. 1.
Figure 4B:
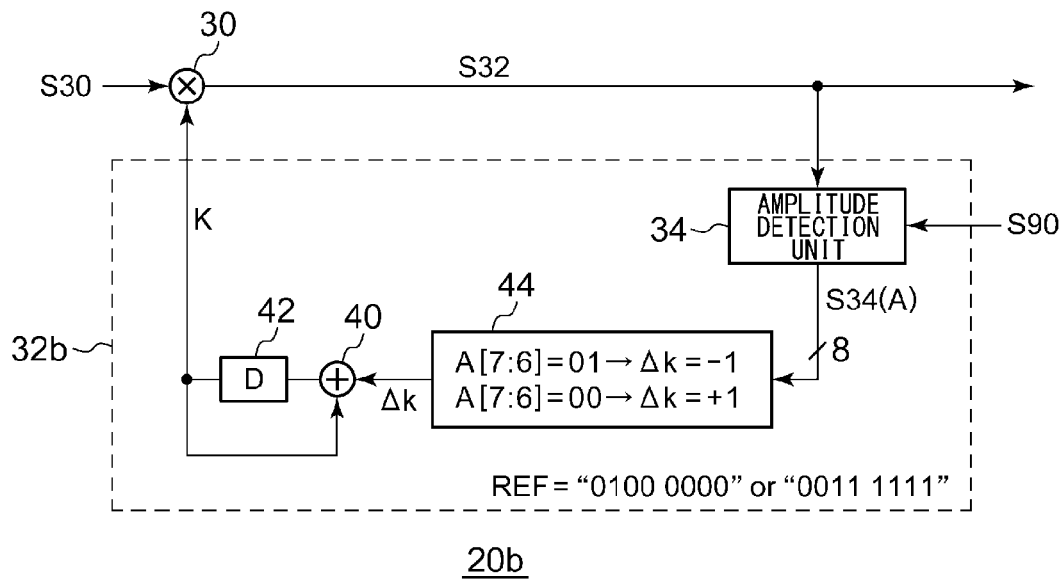

FIGS. 4A and 4B are circuit diagrams each showing an example configuration of the amplitude correction circuit 20 shown in FIG. 1. The amplitude correction circuits 20a and 20b shown in FIGS. 4A and 4B are each configured as a multiply-add calculation unit including a digital multiplier 30 and a coefficient control unit 32, and are each configured to perform an automatic gain control operation (AGC).

The digital multiplier 30 multiplies an input signal S30 thereof by a variable coefficient K. The coefficient control unit 32 compares the amplitude A of an output signal S32 of the digital multiplier 30 with the target value REF. When the amplitude A is greater than the target value REF, the coefficient control unit 32 reduces the variable coefficient K by ΔK. When the amplitude A is smaller than the target value REF, the coefficient control unit 32 raises the variable coefficient K by Δk.

The coefficient control unit 32a shown in FIG. 4A includes an amplitude detection unit 34, a digital subtractor 36, a sign judgment unit 38, a digital adder 40, and a delay circuit 42. The amplitude detection unit 34 samples the value of the signal S32 at either a peak timing or a bottom timing of the waveform of the output signal S32 of the digital multiplier 30, or otherwise at both timings thereof, and generates amplitude data S34 which represents the amplitude of the output signal S32 of the digital multiplier 30. The sampling timing may be indicated by a timing control signal S90 generated by the aforementioned timing detection circuit 90.

The digital subtractor 36 generates an eighth signal S8 (=REF−A) which represents the difference between the amplitude A of the output signal S32 of the digital multiplier 30 and the target value REF. The sign judgment unit 38 outputs a positive or negative predetermined value Δk according to the sign of the eighth signal S8. Specifically, when the sign of the eighth signal S8 is positive, i.e., when REF>A, the sign judgment unit 38 outputs a positive predetermined value Δk (e.g., +1). When the sign of the eighth signal S8 is negative, i.e., when REF<A, the sign judgment unit 38 outputs a negative predetermined value Δk (e.g., −1). It should be noted that, when the amplitude A is equal to the target value REF, i.e., the difference therebetween is zero, the predetermined value Δk may be set to any one of 0, +1, and −1.

The digital adder 40 generates the sum of the predetermined value Δk output from the sign judgment unit 38 and the variable coefficient K. The delay circuit 42 delays the output data S40 of the digital adder 40 by one sampling time, and outputs the resulting data to the digital adder 40 and the digital multiplier 30.

With such a configuration shown in FIG. 4A, such an arrangement is capable of changing the coefficient in increments of constant steps Δk according to the magnitude relation between the amplitude A and the target value REF. Thus, the system converges to a state in which the amplitude A matches the target value REF. That is to say, such an arrangement is capable of stabilizing the amplitude A to a constant value.

Also, an arrangement may be made in which the target value REF is divided by the value of the input signal S30 of the digital multiplier 30, and the input signal S30 is amplified with a gain that corresponds to the division result, whereby the amplitude of the output signal S32 of the digital multiplier 30 can be made to match the target value REF. However, such a method requires a division operation. The amplitude correction circuit 20 according to the embodiment is capable of maintaining the amplitude without involving such a division operation. Thus, such an arrangement has an advantage of a reduced circuit area in comparison with an arrangement employing a divider.

By selecting a suitable value as the target value REF, such an arrangement provides a coefficient control unit 32 having a further simplified configuration. Specifically, the target value REF is preferably set to a value configured as binary data, with all the lower m bits being set to 1 or 0. In other words, the target value is preferably set to a boundary value immediately before a carry or borrow occurs.

FIG. 4B shows an arrangement in which the target value REF is set to [01000000] (the lower six bits are set to all-zero) or [00111111] (the lower six bits are set to all-one), i.e., an arrangement in which the target value REF is set to approximately half the positive full scale of the amplitude A. The coefficient control unit 32b shown in FIG. 4B includes a calculation unit 44 instead of the digital subtractor 36 and the sign judgment unit 38 shown in FIG. 4A.

The calculation unit 44 outputs the positive or negative predetermined value Δk based upon a predetermined bit (lower (m+1)-th bit) of the data S34 that represents the amplitude A of the output signal S32 of the digital multiplier 30. The calculation unit 44 monitors the upper two bits A[7:6] of the amplitude A. When A[7:6] matches "01", the calculation unit 44 outputs Δk=−1. When A[7:6] matches "00", the calculation unit 44 outputs Δk=+1. With such an arrangement, the most significant bit (lower (m+2)-th bit) is redundant. Thus, the calculation unit 44 may generate a predetermined value Δk based upon only the lower (m+1)-th bit, i.e., A[6].

If the target value REF is assumed to be "01000000", when REF=A, the calculation unit 44 outputs Δk=+1. If the target value REF is assumed to be "00111111", when REF=A, the calculation unit 44 outputs Δk=−1.

As described above, by selecting a particular desired value as the target value REF, such an arrangement is capable of controlling the coefficient K using only a bit comparison operation. Thus, such an arrangement provides a simplified circuit configuration of the amplitude correction circuit 20 in comparison with an arrangement shown in FIG. 4A.

Returning to FIG. 1, the control signal generating unit 24 receives the seventh signal S7 from the amplitude control circuit 18, and generates a control signal $S_{CNT}$ (S60, S64) based upon the seventh signal S7 thus received. For example, the control signal generating unit 24 includes an FG signal generating unit 60, a pulse modulator 64, and a calculation unit 68.

The FG signal generating unit 60 generates a control signal (which will also be referred to as the "FG signal") which is set to a first level (e.g., high level) during the first half period of the Hall signal, and to a second level (e.g., low level) during the second half period thereof. For example, the FG signal generating unit 60 switches the level of the control signal S60 every time the seventh signal S7 straddles a threshold value $TH_0$ in the vicinity of zero point.

It should be noted that, in a case in which there is a need to detect the switching between the driving period and the regeneration period, such an arrangement may include a regeneration period detection comparator configured to compare the seventh signal S7 with a predetermined threshold value $TH_1$. With such an arrangement, the output signal of the regeneration period detection comparator is set to the first level (low level) during the regeneration period, and is set to the second level (high level) during the driving period.

The calculation unit 68 is arranged upstream of the pulse modulator 64. The calculation unit 68 multiples the seventh signal S7 by a duty ratio control signal $S_{DUTY}$ which represents a duty ratio for when the fan motor 6 is to be PWM driven, i.e., the rotational speed of the fan motor 6.

For example, the pulse modulator 64 generates the control pulse signal S64 having a duty ratio that corresponds to the level of the seventh signal S7'. For example, the pulse modulator 64 includes a PWM comparator and an oscillator. The oscillator generates a cyclic signal having a triangle waveform or a sawtooth waveform. The oscillator may be configured as a digital counter, for example. The frequency of the control pulse signal S64 is preferably set to be higher than the audible band in order to prevent the occurrence of unpleasant audible noise that can be recognized by the user of the electronic device 1, and, specifically, is preferably set to be 20 kHz or more. Giving consideration to irregularities in the circuit, the frequency of the control pulse signal S64 is preferably set to be double the aforementioned frequency, i.e., on the order of 50 kHz or more. The PWM comparator compares the seventh signal S7' having an amplitude that has been adjusted by the calculation unit 68 with a cyclic signal so as to generate the control pulse signal S64 that has been subjected to pulse-width modulation.

The configuration of the pulse modulator 64 is not restricted in particular. The pulse modulator 64 may be configured using a counter, for example.

The driver circuit 26 drives the fan motor 6 according to the control signal $S_{CNT}$ (S60, S64). The driver circuit 26 includes a logic unit 26a, a pre-driver circuit 26b, and an H-bridge circuit 26c, for example. The configuration of the driver circuit 26 is not restricted in particular. Also, the driver circuit 26 may be configured using the same circuit as that of a driver IC configured as a conventional analog circuit.

The driver circuit 26 alternately selects either a pair of oppositely positioned switches M1 and M4 or a pair of oppositely positioned switches M2 and M3 according to the level of the FG signal S60. In the regeneration period, the driver circuit 26 performs PWM driving (soft switching) of the selected switch pair of the H-bridge circuit according to the control pulse signal S64. Furthermore, in the driving period, the driver circuit 26 performs PWM driving of the fan motor 6, with a duty ratio that corresponds to the target torque.

The above is the configuration of the driving IC 100. Next, description will be made regarding the operation thereof.

Figure 5A:
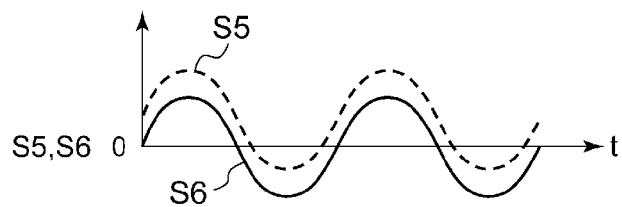
FIGS. 5A through 5F are circuit diagrams showing the respective blocks of the driving IC shown in FIG. 1.
Figure 5B:
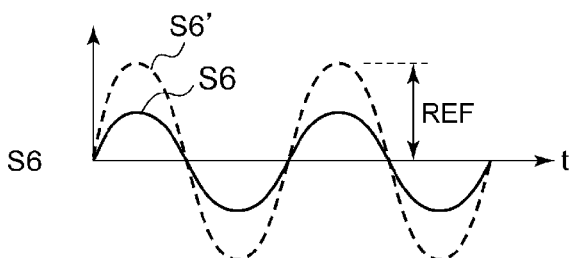
Figure 5C:
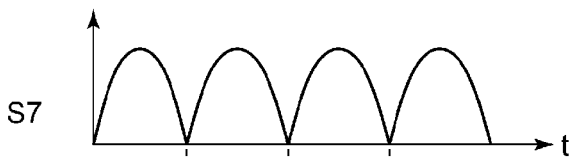

FIGS. 5A through 5F are waveform diagrams which show the operations of the respective blocks of the driving IC 100 shown in FIG. 1. As shown in FIG. 5A, the offset of the fifth signal S5 is corrected by the offset correction circuit 16. Subsequently, as shown in FIG. 5B, the amplitude control circuit 18 performs a correction operation such that the amplitude of the sixth signal S6 matches the target value REF. Subsequently, as shown in FIG. 5C, the amplitude correction circuit 20 generates the absolute value of the sixth signal S6, thereby generating the seventh signal S7.

Figure 5D:

The FG signal generating unit 60 generates the FG signal S60 shown in FIG. 5D based upon the seventh signal S7.

Figure 5E:
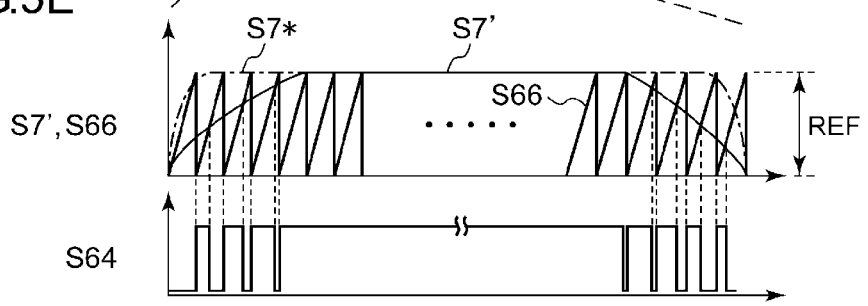
Figure 5F:
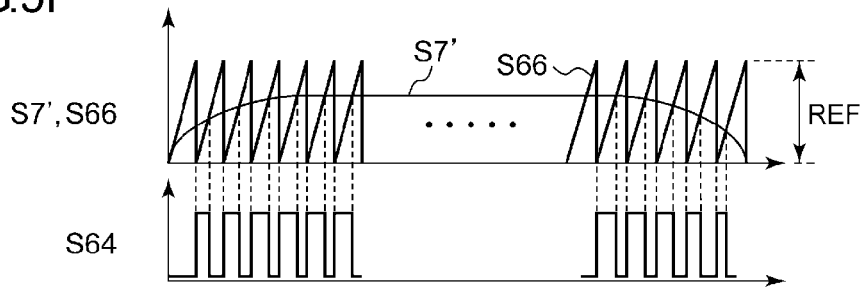

As shown in FIGS. 5E and 5F, the pulse modulator 64 generates the control pulse signal S64 subjected to pulse-width modulation by comparing the seventh signal S7' with the cyclic signal S66, for example.

There is a difference in the amplitude of the seventh signal S7' between a case shown in FIG. 5E and a case shown in FIG. 5F. FIG. 5E shows a case in which the duty ratio control signal $S_{DUTY}$ is set to 1 (i.e., to 100%). FIG. 5F shows a case in which the duty ratio control signal $S_{DUTY}$ is set to be smaller than 1. It can be understood that the amplitude of the seventh signal S7' changes according to the change in the value of the duty ratio control signal $S_{DUTY}$, and the duty ratio of the control pulse signal S64 changes according to the change in the amplitude of the seventh signal S7'.

The driver circuit 26 drives the fan motor 6 according to the control signal $S_{CNT}$ (S60, S64). With the driving IC 100 shown in FIG. 1, by converting the Hall signal S1 and S2 into digital data, by canceling out the offset of the Hall signal, and by performing amplitude correction, such an arrangement is capable of driving the fan motor 6 while reducing the effects of irregularities in the Hall sensor, and so forth.

Also, the driving IC 100 can be configured as a digital circuit. Thus, with such an arrangement, the circuit can be miniaturized by means of a semiconductor manufacturing process, thereby providing the advantage of chip shrink as compared with a case in which the driving IC 100 is configured as an analog circuit. Thus, such an arrangement provides such a driving IC 100 having a reduced size and with reduced costs. Furthermore, such an arrangement performs a digital signal operation, thereby providing an advantage of being resistant to effects of irregularities in circuit elements as compared with conventional driving ICs configured as an analog circuit.

Typical driving ICs configured as an analog circuit amplify the Hall signal H+ and H− with a high gain in order to reduce the effects of the offset of the Hall signal H+ and H− or to reduce the effects of irregularities in the amplitude thereof. This leads to distortion of the peak and the bottom of a signal (which will be indicated by "S7*") that corresponds to the seventh signal shown in FIG. 1, as indicated by the line of dashes and dots shown in FIG. 5E, which results in the signal S7* having a waveform similar to a trapezoidal waveform. The signal S7* has an excessively steep slope in each phase switching period. Accordingly, it is difficult to gradually change the duty ratio of a signal that corresponds to the control pulse signal S64 as shown in FIG. 5E.

In contrast, with the driving IC 100 shown in FIG. 1, the duty ratio of the control pulse signal S64 can be gradually changed. Thus, such an arrangement is capable of smoothly switching the phase, thereby reducing noise that occurs in the fan motor 6.

[Second Embodiment]

Figure 6A:
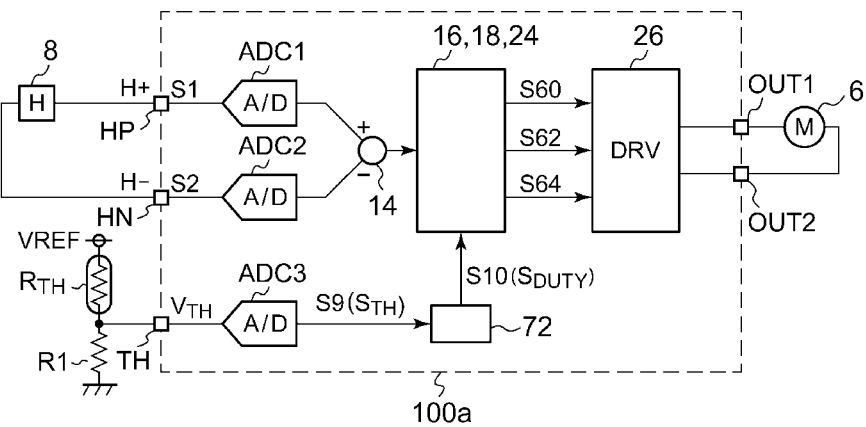
FIGS. 6A through 6C are circuit diagrams each showing a configuration of a driving IC according to a second embodiment.
Figure 6B:
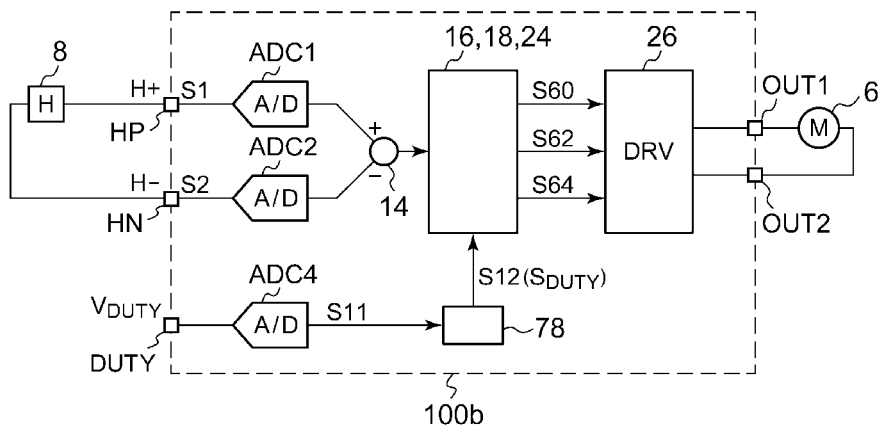
Figure 6C:
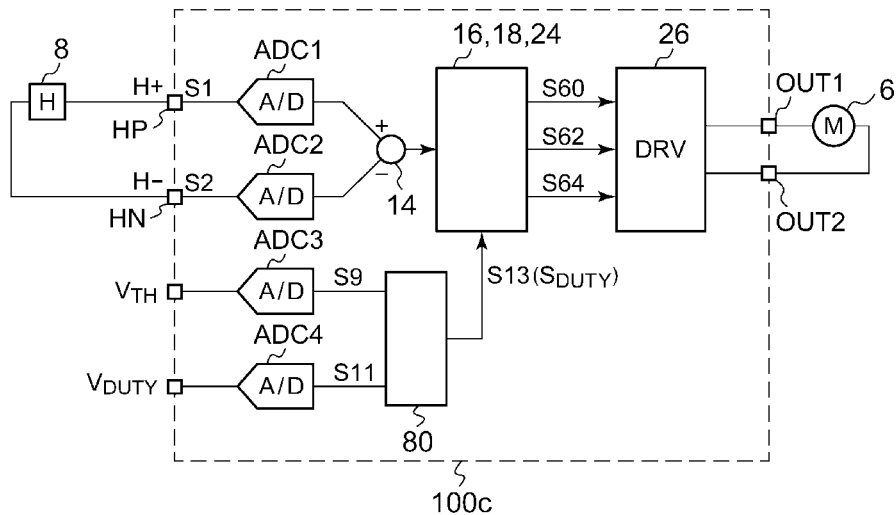

Description will be made in the second embodiment regarding a rotational driving control operation for the fan motor 6 according to the temperature or an external control signal. FIGS. 6A through 6C are circuit diagrams each showing a configuration of a driving IC 100 according to the second embodiment.

In FIG. 6A through 6C, the same circuit blocks as those shown in FIG. 1 are not shown as appropriate. FIG. 6A is a circuit diagram which shows a configuration of a driving IC 100a configured to perform a rotational driving control operation according to the temperature.

The driving IC 100a includes a thermistor terminal TH, a third A/D converter ADC3, and a control instruction circuit 72.

The thermistor terminal TH is connected to a thermistor RTH biased by a reference voltage $V_{REF}$. The thermistor terminal TH receives, as an input signal, an analog temperature detection voltage $V_{TH}$ that corresponds to the temperature. The third A/D converter ADC3 performs analog/digital conversion of the temperature detection signal $V_{TH}$ so as to generate a ninth signal S9 ($S_{TH}$) configured as a digital signal that corresponds to the temperature. According to the ninth signal S9, the control instruction circuit 72 generates a tenth signal S10 which indicates the duty ratio to be used to perform PWM driving. As the temperature becomes higher, the value of the tenth signal S10 also becomes higher, and as the temperature becomes lower, the value of the tenth signal S10 also becomes lower. The tenth signal S10 is a signal that corresponds to the duty ratio control signal $S_{DUTY}$ shown in FIG. 1. The tenth signal S10 is input to the calculation unit 68 included in the control signal generating unit 24.

As a result, the control pulse signal S64 generated by the control signal generating unit 24 is subjected to pulse width modulation according to the temperature. The driver circuit 26 performs a PWM driving operation for the fan motor 6 according to the control pulse signal S64, i.e., according to the tenth signal S10.

With the driving IC 100a shown in FIG. 6A, such an arrangement is capable of raising the rotational speed of the fan motor 6 according to an increase in the temperature, thereby appropriately cooling the CPU 4.

FIG. 6B is a circuit diagram which shows a configuration of a driving IC 100b configured to perform a rotational speed control operation according to an external duty ratio control voltage. The duty ratio control voltage $V_{DUTY}$ has a level that corresponds to the duty ratio to be used to perform PWM driving of the fan motor 6, i.e., a level that corresponds to the target value of the rotational speed. The duty ratio control voltage $V_{DUTY}$ is input to a duty ratio control terminal DUTY.

A fourth A/D converter ADC4 performs analog/digital conversion of the duty ratio control voltage $V_{DUTY}$ so as to generate an eleventh signal S11 configured as a digital signal. According to the eleventh signal S11, the control instruction circuit 78 generates a twelfth signal S12 which represents the duty ratio to be used to perform PWM driving.

With the driving IC 100b shown in FIG. 6B, such an arrangement is capable of controlling the rotational speed of the fan motor 6 according to the external control voltage $V_{DUTY}$. Thus, such an arrangement provides a flexible platform to the designer of the cooling apparatus 2.

FIG. 6C is a circuit diagram which shows a configuration of a driving IC 100c configured to perform a rotational speed control operation according to the temperature and an external duty ratio control voltage. The driving IC 100c shown in FIG. 6C has a configuration obtained by combining the configurations of the driving ICs 100a and 100b shown in FIGS. 6A and 6B. Based upon both the ninth signal S9 and the eleventh signal S11, a control instruction combining circuit 80 generates a thirteenth signal S13 which represents the duty ratio to be used to perform PWM driving. With the driving IC 100c shown in FIG. 6C, such an arrangement is capable of controlling the rotational speed of the fan motor 6 based upon the control voltage $V_{DUTY}$ and the temperature.

[Third Embodiment]

In some cases, heat generation of a CPU to be cooled, the temperature thereof, the thermal runaway threshold voltage thereof, and so on, differ for each CPU. Accordingly, the rotational speed of the cooling fan is preferably set in a flexible manner according to the target to be cooled. Description will be made in the third embodiment regarding a technique for providing a flexible rotational speed control operation.

Figure 7:
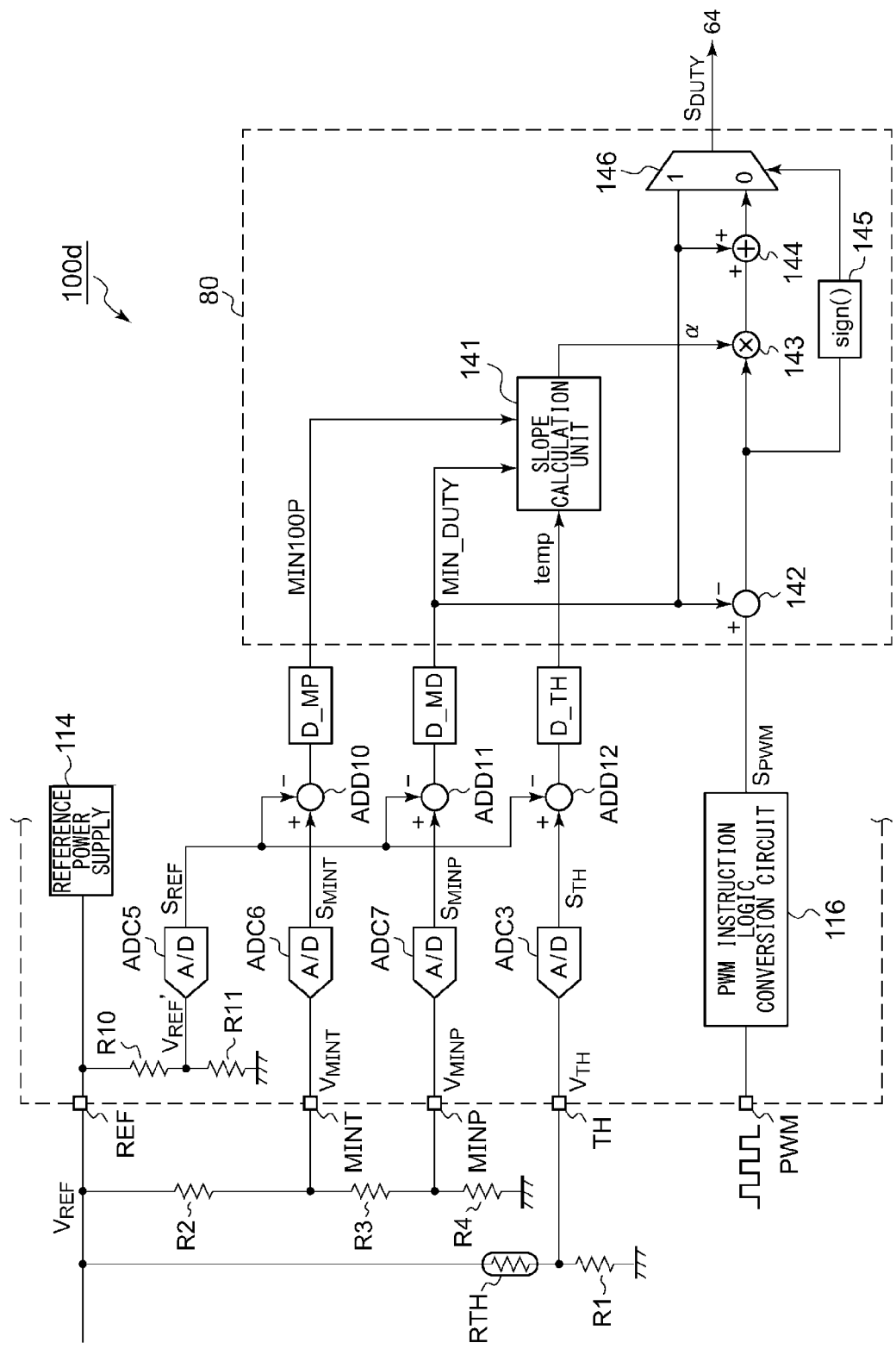
FIG. 7 is a circuit diagram which shows a part of a configuration of a driving IC according to a third embodiment.

FIG. 7 is a circuit diagram which shows a part of a configuration of a driving IC 100d according to a third embodiment.

The driving IC 100d shown in FIG. 7 includes a PWM pulse signal input terminal PWM instead of the duty ratio control terminal DUTY shown in FIGS. 6B and 6C. An external PWM signal PWM subjected to pulse width modulation is input to the PWM pulse signal input terminal PWM. The driving IC 100 performs PWM driving of the fan motor 6 according to the duty ratio of the external PWM signal. The duty ratio of the external PWM signal PWM is set in a range of 0 to 100%.

Figure 8:
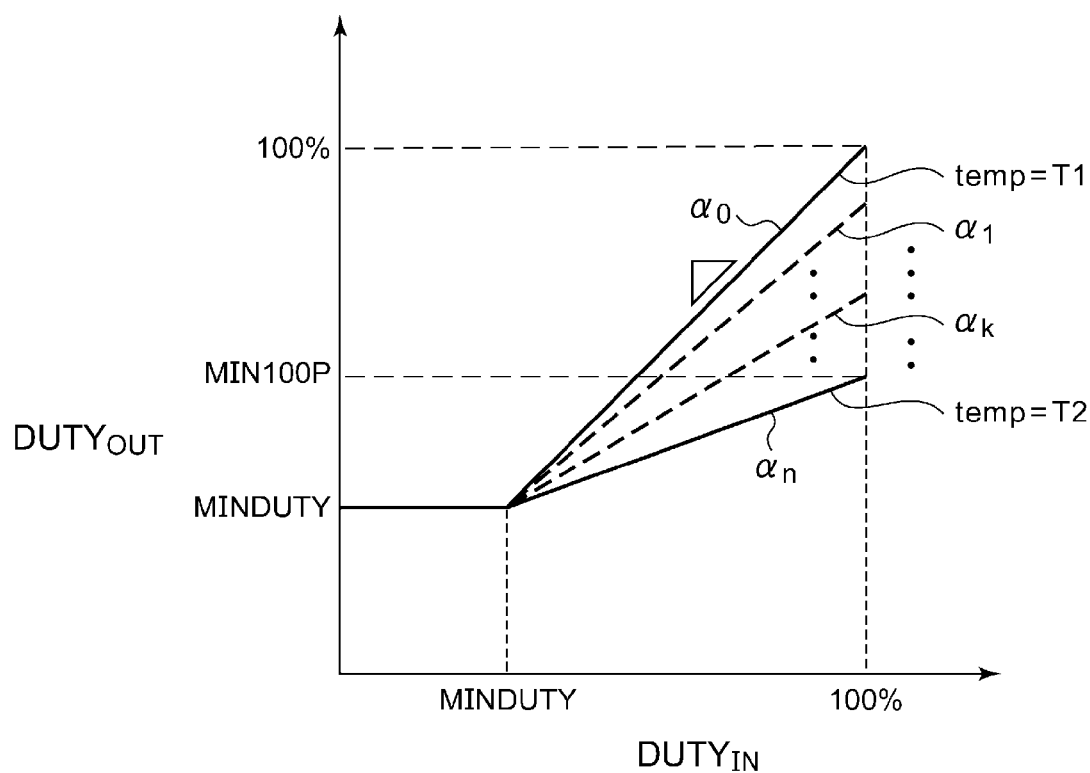
FIG. 8 is a graph which shows a PWM control operation of the driving IC shown in FIG. 7.

The driving IC 100d performs a PWM driving operation for the fan motor 6 according to the duty ratio of the external PWM signal PWM and the temperature temp. FIG. 8 is a graph which shows a PWM control operation of the driving IC 100d shown in FIG. 7. In FIG. 8, the horizontal axis represents the duty ratio (input duty ratio $DUTY_{IN}$) of the external PWM signal, and the vertical axis represents the duty ratio (output duty ratio $DUTY_{OUT}$) of the PWM driving operation.

As shown in FIG. 8, when the input duty ratio is lower than the minimum duty ratio MINDUTY, the driving IC 100d drives the fan motor 6 with a minimum duty ratio MINDUTY. When the input duty ratio $DUTY_{IN}$ is higher than the minimum duty ratio MINDUTY, the output duty ratio $DUTY_{OUT}$ is raised according to the slope α, which is determined by the temperature. The slope α is set as follows.

(1) temp>$T_{UPPER}$ $$\alpha_0 = 1$$

(2) temp<$T_{LOWER}$ $$\alpha_n = (MIN100P - MINDUTY)/(100 - MINDUTY)$$

(3) $T_{LOWER} \leq$ temp $\leq T_{UPPER}$

The slope $\alpha_k$ in this range is switched in a stepwise manner, such as n=16 levels, for example, according to the temperature temp. That is to say, α3 is represented by the Expression $\alpha_k = (\alpha_0 - \alpha_n)/n \times k$.

Returning to FIG. 7, the driving IC 100d receives analog voltages that indicate MIN100P, MINDUTY, $T_{LOWER}$, and $T_{UPPER}$.

The driving IC 100d includes a reference power supply 114, A/D converters ADC3, and ACD5 through ADC7, a PWM instruction logic conversion circuit 116, and a control instruction combining circuit 80.

The reference power supply 114 generates a reference voltage $V_{REF}$, and outputs the reference voltage $V_{REF}$ thus generated via a reference voltage terminal REF. The reference voltage $V_{REF}$ is divided by external resistors R2, R3, and R4, so as to generate a thermistor control minimum output duty setting voltage $V_{MINT}$ and a PWM control minimum output duty setting voltage $V_{MINP}$. The thermistor control minimum output duty setting voltage $V_{MINT}$ and the PWM control minimum output duty setting voltage $V_{MINP}$ thus generated are input to a thermistor control minimum output duty setting input terminal MINT and a PWM control minimum output duty setting input terminal MINP, respectively. The reference voltage $V_{REF}$ is divided by internal resistors R10 and R11, thereby generating a reference voltage $V_{REF}'$.

The A/D converters ADC5 through ADC7 respectively perform analog/digital conversion of the voltages $V_{REF}'$, $V_{MINT}$, and $V_{MIP}$, so as to generate data signals $S_{REF}$, $S_{MINT}$, $S_{MINP}$, and $S_{SS}$. Adder-subtractors ADD10 through ADD12 respectively subtract the data $S_{REF}$ from the data signals $S_{MINT}$, $S_{MINP}$, $S_{TH}$, and $S_{TSS}$, so as to shift these data signals, thereby generating data signals MIN100P, MIN_DUTY, and temp.

The PWM instruction logic conversion circuit 116 generates a data signal $S_{PWM}$ which indicates a value that corresponds to the duty ratio of the external PWM signal. The PWM instruction logic conversion circuit 116 converts the PWM signal having a duty ratio of 0 to 100% into an L-bit signal $S_{PWM}$. For example, in a case in which L=7, the 0 to 100% duty ratio is converted into a digital value of 0 to 127.

The control instruction combining circuit 80 generates a duty ratio control signal $S_{DUTY}$ based upon the control data SPWM, the data signals MIN100P, MIN_DUTY, and temp.

The control instruction combining circuit 80 includes a slope calculation unit 141, a first calculation unit 142, a second calculation unit 143, a third calculation unit 144, a sign judgment unit 145, and a selector 146.

The slope calculation unit 141 calculates the slope a based upon the aforementioned rules.

The first calculation unit 142 subtracts MIN_DUTY from the data $S_{PWM}$. The second calculation unit 143 multiples the output data of the first calculation unit 142, i.e., ($S_{PWM}$–MIN_DUTY) by the slope α. The third calculation unit 144 generates the sum of MIN_DUTY and α×($S_{PWM}$–MIN_DUTY).

The sign judgment unit 145 judges the sign of the calculation result obtained by the first calculation unit 142, i.e., ($S_{PWM}$–MIN_DUTY). When the sign sign is positive, i.e., when $S_{PWM}$>MINDUTY, the selector 146 selects the data α×($S_{PWM}$–MIN_DUTY)+MIN_DUTY input via the input (0). When the sign sign is negative, the selector 146 selects the data MIN_DUTY input via the input (1). The output data $S_{DUTY}$ of the selector 146 is output to a pulse modulator.

With the driving IC 100d shown in FIG. 7, such an arrangement is capable of appropriately controlling the rotational speed of the fan motor 6 based upon the external PWM signal PWM and the temperature according to the characteristics shown in FIG. 8. Specifically, by means of a digital control operation, such an arrangement is capable of independently setting the minimum rotational speed of the fan motor 6 and the temperature dependence of the rotational speed thereof.

Figure 9:
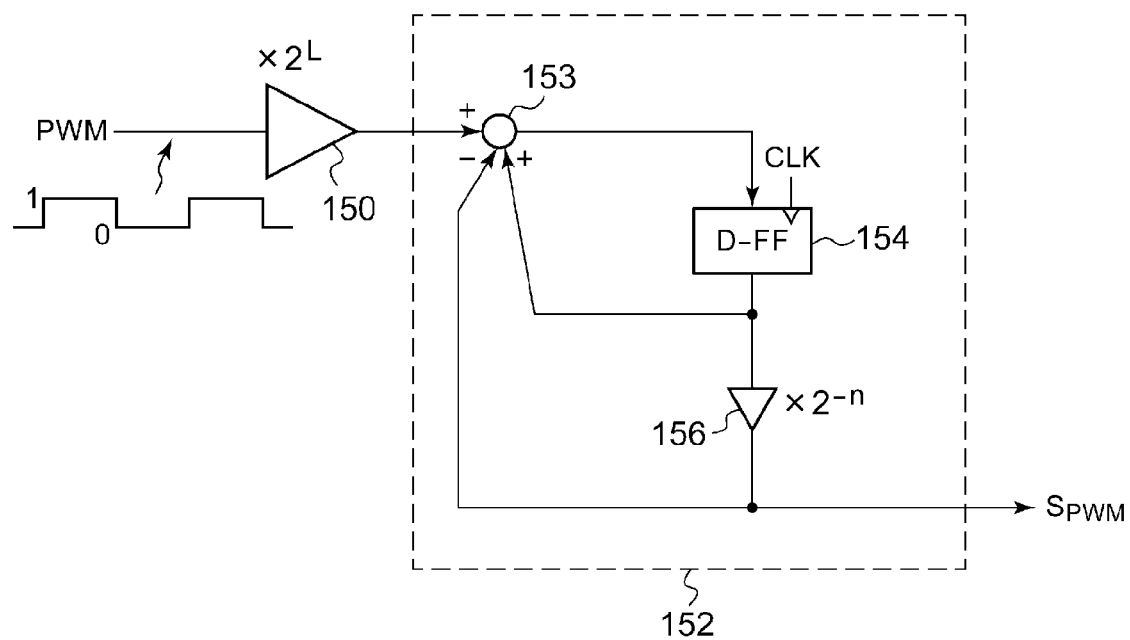
FIG. 9 is a circuit diagram which shows an example configuration of a PWM instruction logic conversion circuit.

FIG. 9 is a circuit diagram which shows a configuration of the PWM instruction logic conversion circuit 116. The PWM instruction logic conversion circuit 116 includes a level conversion circuit 150 and a digital filter 152.

The high level of the external PWM signal PWM is converted into 1, and the low level thereof is converted into 0. In order to provide such an operation, the external PWM signal may be input to a CMOS as an input signal. The level conversion circuit 150 multiples the external PWM signal converted into a 1/0 binary signal by a coefficient $2^L$. When L=7, the external 1/0 PWM signal is converted into a 128/0 signal, and the resulting signal is input to the digital filter 152 arranged as a downstream component.

The digital filter 152 is configured as a first-order IIR (Infinite Impulse Response) low-pass filter, and includes a fourth calculation unit 153, a delay circuit 154, and a fifth calculation unit 156, arranged in series.

The delay circuit 154 has a bit width (L+n), and delays the output data of the fourth calculation unit 153 by a delay time $T_{CLK}$ in synchronization with the clock signal CLK having the predetermined period $T_{CLK}$.

The fourth calculation unit 153 multiples the output data of the delay circuit 154 by a coefficient $2^{-n}$. The constant n determines the frequency characteristics of the low-pass filter. The fourth calculation unit 153 and the fifth calculation unit 156 may each be configured as a bit shifter configured to bit-shift the input data.

The fourth calculation unit 153 generates the sum of the output data of the level conversion circuit 150 and the output data of the delay circuit 154, subtracts the output data of the fifth calculation unit 156 from the resulting data, and outputs the calculation result to the delay circuit 154.

Figure 10A:
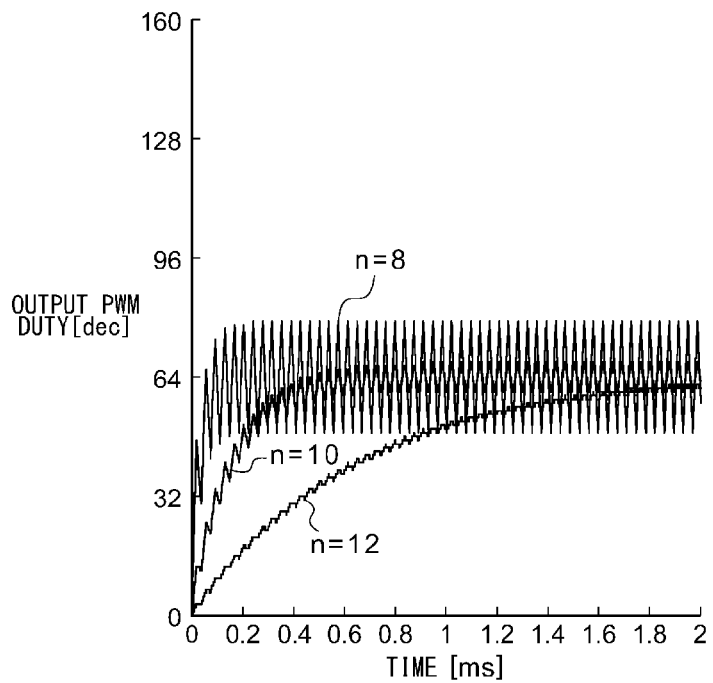
FIGS. 10A and 10B are graphs each showing the operation of the PWM instruction logic conversion circuit shown in FIG. 9.
Figure 10B:
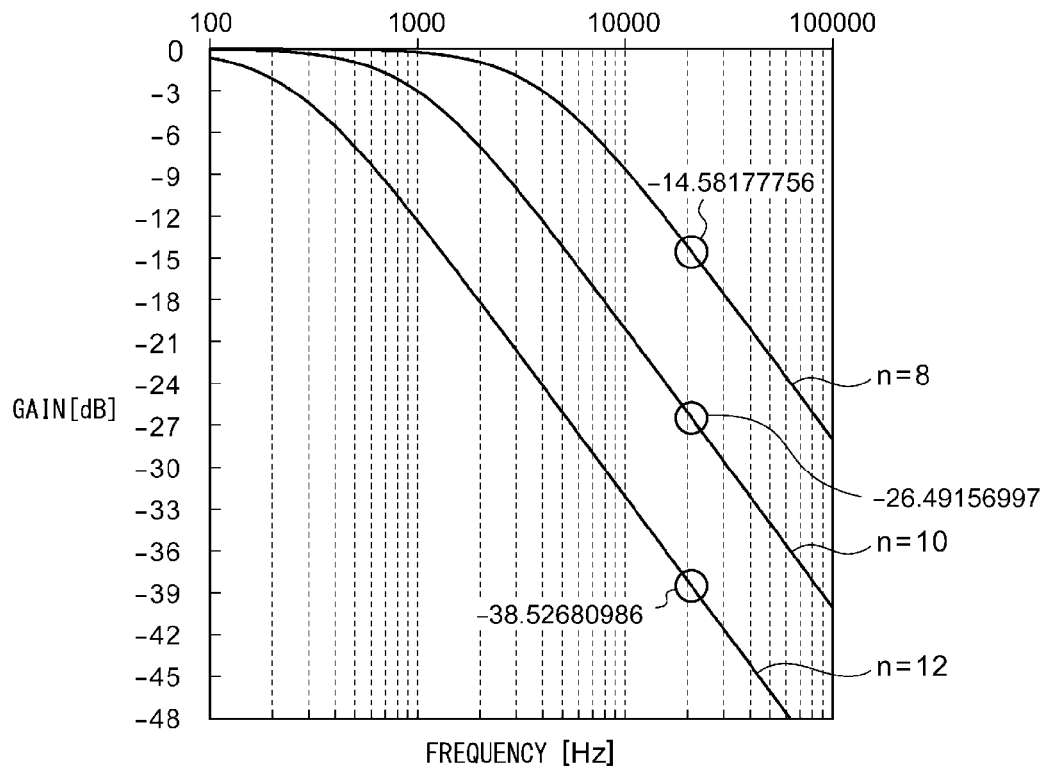

FIGS. 10A and 10B are graphs each showing an operation of the PWM instruction logic conversion circuit shown in FIG. 9. FIG. 10A shows the data signal $S_{PWM}$ when the external PWM signal has a duty ratio of 50%. The gain (responsiveness) of the feedback loop and the ripple in the data signal $S_{PWM}$ change according to change in the filtering coefficient n.

Description will be made regarding the frequency $f_{CLK}$ of the clock signal CLK. In a case in which the duty ratio of the external PWM signal is converted into an L-bit signal, the duty ratio is preferably converted with $½^L$ precision or lower. For example, in a case in which the duty ratio of the external PWM signal is converted into an L=7-bit signal (0-127), the duty ratio is preferably converted with precision of ½₁₂₈ (approximately 1% precision) or lower. Assuming that the carrier frequency $f_{PWM}$ of the PWM signal is 28 kHz, by setting the frequency $f_{CLK}$ of the clock signal CLK to be $2^L$ (=128) times the carrier frequency $f_{PWM}$ of the PWM signal, i.e., to be 3.6 MHz or more, such an arrangement is capable of generating a data signal $S_{PWM}$ for every cycle of the external PWM signal without missing any data. Such an arrangement prevents the occurrence of beating.

Next, description will be made regarding the filtering coefficient n. FIG. 10B is a graph which shows the low-pass filter characteristics of the PWM instruction logic conversion circuit 116. In order to suppress ripple in the output data $S_{PWM}$ to 1 step or less, the required gain G is on the order of ½₁₂₈=–42 dB. An arrangement in which n=12 provides a removal efficiency on the order of –38.5 dB when the carrier frequency $f_{PWM}$ of the external PWM signal PWM is 21 kHz. As the carrier frequency $f_{PWM}$ becomes higher, such an arrangement provides higher removal efficiency.

[Fourth Embodiment]

Figure 11:
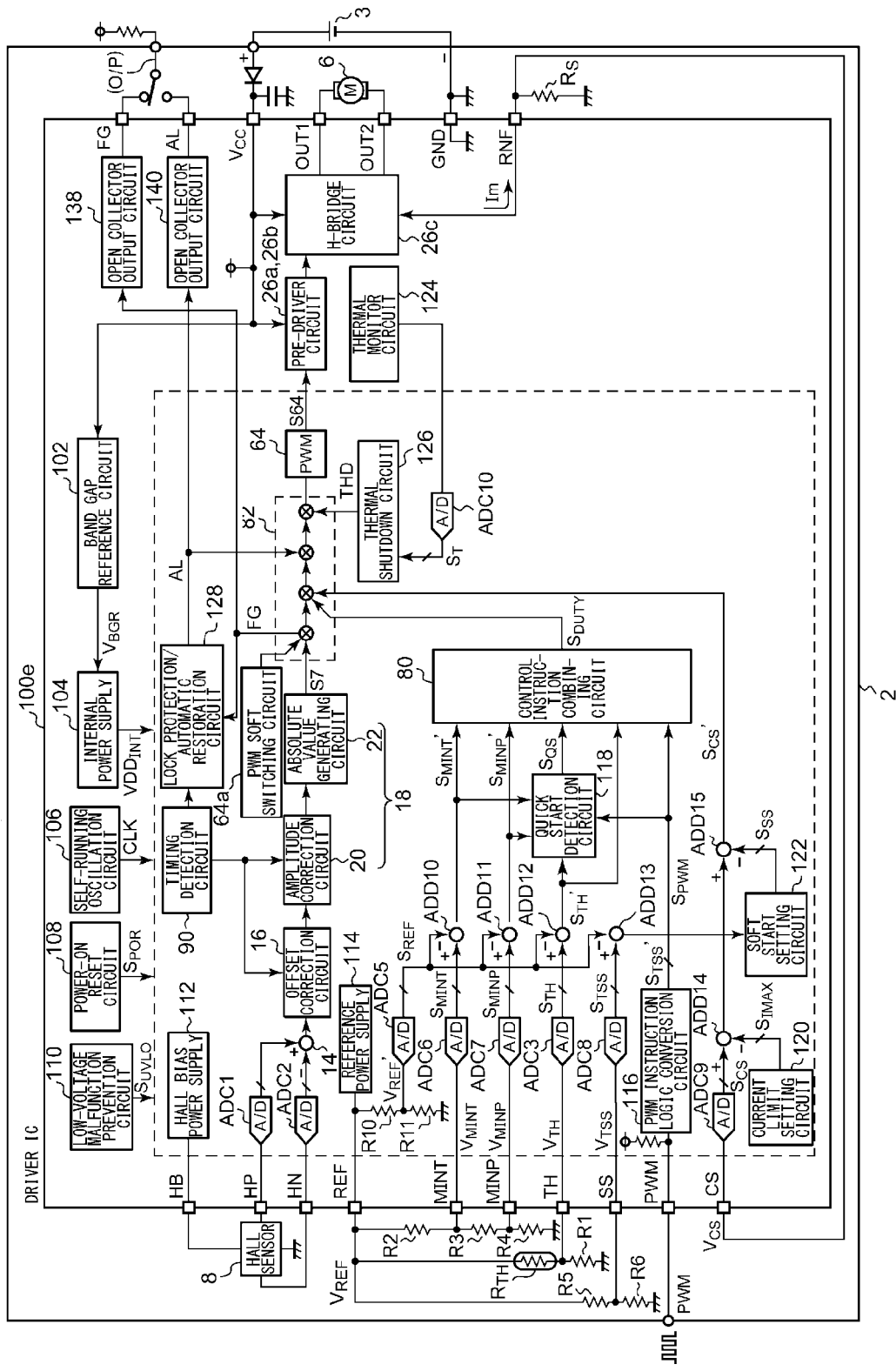
FIG. 11 is a block diagram which shows a configuration of a cooling apparatus employing a driving IC according to a fourth embodiment.

FIG. 11 is a block diagram which shows a configuration of a cooling apparatus 2 employing a driving IC 100e according to a fourth embodiment. The driving IC 100e according to the fourth embodiment employs the techniques described in the aforementioned first through third embodiments. Description will be made below regarding each block of the driving IC 100e.

A power supply terminal Vcc and a ground terminal GND are each connected to an external power supply 3, and respectively receive the power supply voltage and the ground voltage.

A band gap reference circuit 102 generates a reference voltage $V_{BGR}$. An internal power supply 104 is configured as a linear regulator, for example. The internal power supply 104 receives the reference voltage $V_{BGR}$, and generates a stabilized internal power supply voltage $VDD_{INT}$ according to the value of the reference voltage $V_{BGR}$. A self-running oscillator circuit 106 generates a clock signal CLK having a predetermined frequency.

A power-on reset circuit 108 generates a power-on reset signal $S_{POR}$ by comparing the power supply voltage Vcc with a predetermined threshold voltage. A low-voltage malfunction prevention circuit (UVLO: Under Voltage Lock Out) 110 generates a UVLO signal $S_{UVLO}$ by comparing the power supply voltage Vcc with a predetermined threshold voltage. These signals $S_{POR}$ and $S_{UVLO}$ are used to protect the circuit.

A Hall bias power supply 112 generates a Hall bias voltage $V_{HB}$, and outputs the Hall bias voltage $V_{HB}$ thus generated via a Hall bias terminal HB. The Hall bias voltage $V_{HB}$ is supplied to a Hall sensor 8.

The driving IC 100 has a soft start function for gradually raising the rotational speed at the start of rotation of the fan motor 6. The period of the soft start operation is determined according to a soft start period setting voltage V. External resistors R5 and R6 divide the reference voltage $V_{REF}$ so as to generate the soft start period setting voltage $V_{TSS}$, and input the soft start period setting voltage $V_{TSS}$ thus generated to a soft start period setting input terminal SS. An A/D converter ADC8 performs analog/digital conversion of the soft start setting voltage $V_{TSS}$ so as to generate a data signal $S_{TSS}$. An adder-subtractor ADC13 subtracts the data $S_{REF}$ from the data signal $S_{TSS}$ so as to shift the data $S_{TSS}$, and outputs the data $S_{TSS}'$ thus obtained.

Based upon the signal $S_{TSS}'$ which indicates the soft start period, a soft start setting circuit 122 generates a soft start setting signal $S_{SS}$ which gradually rises over time, with a slope that corresponds to the value of the signal $S_{TSS}'$.

A quick start detection circuit 118 detects if the stationary state of the motor is due to the external PWM signal PWM or if it is due to abnormal motor operation. In a case in which the stationary state of the motor is due to the external PWM signal PWM, the lock protection function is disabled. Such a quick start function allows the motor to start to rotate immediately after the PWM signal "H" is input when the motor has entered the stationary state due to the PWM signal.

The control instruction combining circuit 80 receives the signals $S_{MINT}'$, $S_{MINP}'$, $S_{TH}'$, $S_{PWM}$, and $S_{QS}$, and combines these signals thus received so as to generate a control signal $S_{DUTY}$ which indicates the duty ratio to be used to perform a PWM driving operation for the fan motor 6.

An external detection resistor Rs is connected to an output current detection terminal RNF. A voltage drop (detection voltage) $V_{CS}$ occurs at the detection resistor Rs according to the current Im that flows through the fan motor 6. The detection voltage $V_{CS}$ is input to a detection current input terminal CS of the driving IC 100. A ninth A/D converter ADC9 converts the detection voltage $V_{CS}$ into a digital-valued detection signal $S_{CS}$. A current limit setting circuit 120 generates data $S_{IMAX}$ which represents the upper limit of the current Im that flows through the fan motor 6.

Adder-subtractors ADD15 and ADD16 sequentially subtract the signals $S_{IMAX}$ and $S_{SS}$ from the detection signal $S_{CS}$ so as to generate a current upper limit signal $S_{CS}'$. The current upper limit signal $S_{CS}'$ limits the duty ratio with which the fan motor 6 is PWM driven, and limits the current Im that flows through the fan motor 6 to be equal to or lower than a current value that corresponds to the signal $S_{IMAX}$. Furthermore, such an arrangement provides a soft start operation when the motor is started.

A calculation unit 82 generates an FG signal (S60) based upon the seventh signal S7 output from the amplitude control circuit 18 as described above. An open collector output circuit 138 outputs the FG signal via a rotational speed pulse output terminal FG.

The driving IC 100 includes a lock protection function. A lock protection/automatic restoration circuit (which will be referred to as the "lock protection circuit" hereafter) 128 monitors the FG signal, detects a stationary state due to abnormal motor operation, and generates a detection signal (lock alarm signal) AL that indicates this abnormal state. An open collector output circuit 140 outputs the lock alarm signal AL via a lock alarm output terminal AL.

A thermal monitor circuit 124 monitors the chip temperature of the driving IC 100, and generates a chip temperature voltage $V_T$ that corresponds to the chip temperature. An A/D converter ADC10 performs analog/digital conversion of the chip temperature voltage $V_T$ so as to generate a chip temperature signal $S_T$. When the chip temperature signal $S_T$ is higher than a predetermined threshold value, i.e., when the driving IC 100 is in an abnormal temperature state, a thermal shutdown circuit 126 asserts a thermal shutdown signal TSD.

The calculation unit 82 multiplies the seventh signal S7 by the duty ratio control signal $S_{DUTY}$ and the current upper limit signal $S_{SC}'$ so as to generate the control signal S7'. Furthermore, when the lock alarm signal AL or the thermal shutdown signal THD is asserted, the calculation unit 82 sets the level of the control signal S7' to zero so as to stop the supply of electric power to the fan motor 6.

The above is the configuration of the driving IC 100e. With the driving IC 100e, such an arrangement is capable of controlling the rotational speed of the fan motor 6 according to the duty ratio of the external PWM signal and the temperature. Furthermore, such an arrangement provides such a soft start function, a lock protection function, and a quick start function, by means of a single function IC.

Figure 12:
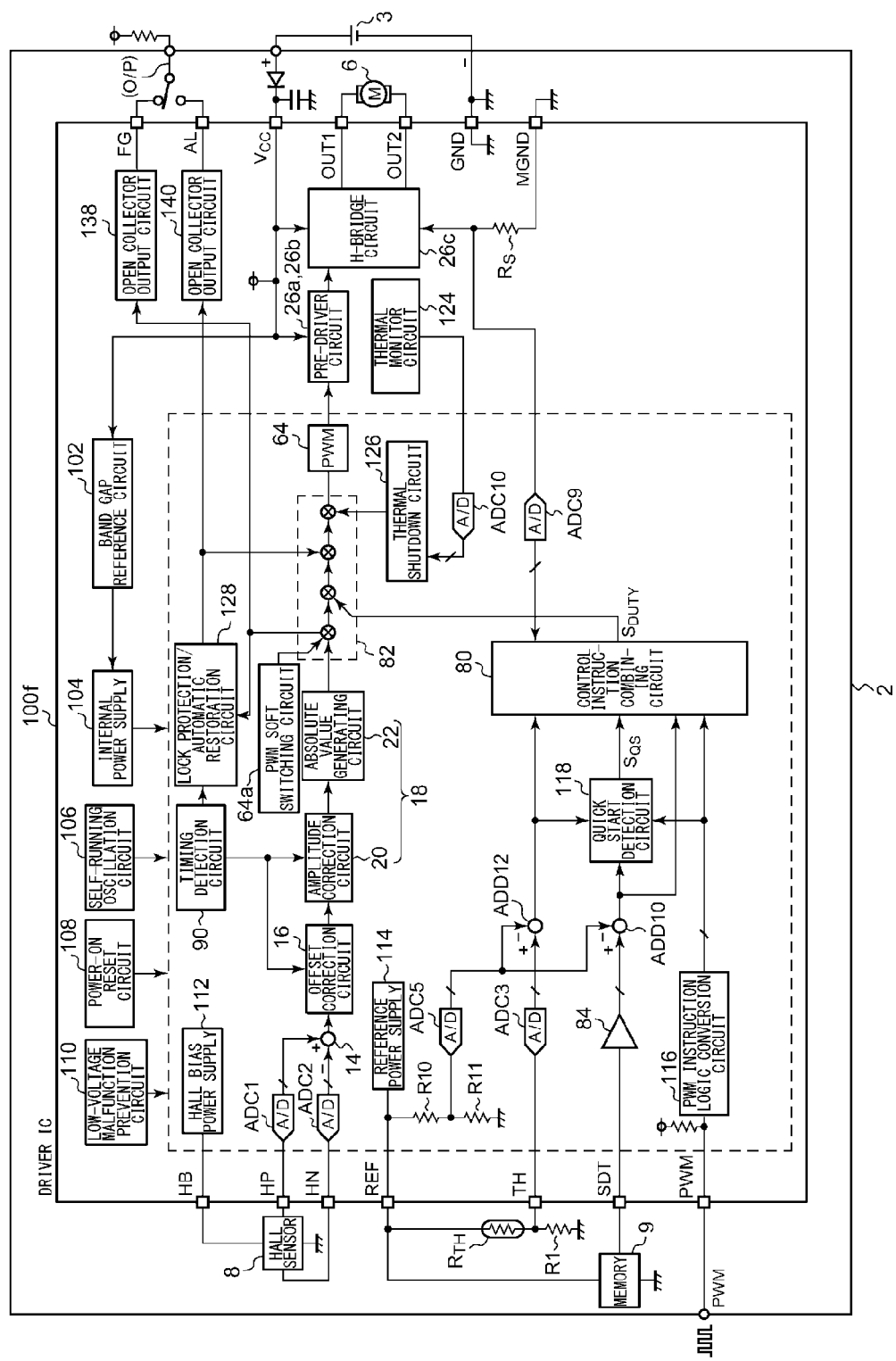
FIG. 12 is a circuit diagram which shows a modification of the driving IC shown in FIG. 11.

FIG. 12 is a circuit diagram which shows a modification of the driving IC shown in FIG. 11. Description will be made regarding only the point of difference from an arrangement shown in FIG. 11. A driving IC 100f includes a control instruction serial data input terminal SDT. The terminal SDT is connected to external memory 9 or an external CPU. Data that corresponds to at least one of the data $S_{MINT}$, $S_{MINP}$, $S_{TSS}$, and $S_{IMAX}$ described with reference to FIG. 8 is input to the control instruction serial data input terminal SDT. A reception circuit 84 receives serial data SDT, and outputs the serial data STD thus received to the control instruction combining circuit 80. The memory 9 may be configured as a built-in component of the driving IC 100f.

Furthermore, a detection resistor Rs is configured as a built-in component of the driving IC 100f. The output data $S_{CS}$ of the A/D converter ADC9 is input to the control instruction combining circuit 80. The control instruction combining circuit 80 generates a duty ratio control signal $S_{DUTY}$ such that the detection signal $S_{CS}$ does not exceed the current limit setting value included in the serial data SDT.

With the driving IC 100e shown in FIG. 12, by supplying the data from the memory or CPU to the control instruction serial data input terminal SDT, such an arrangement is capable of changing the settings of the driving IC 100f.

Figure 13:
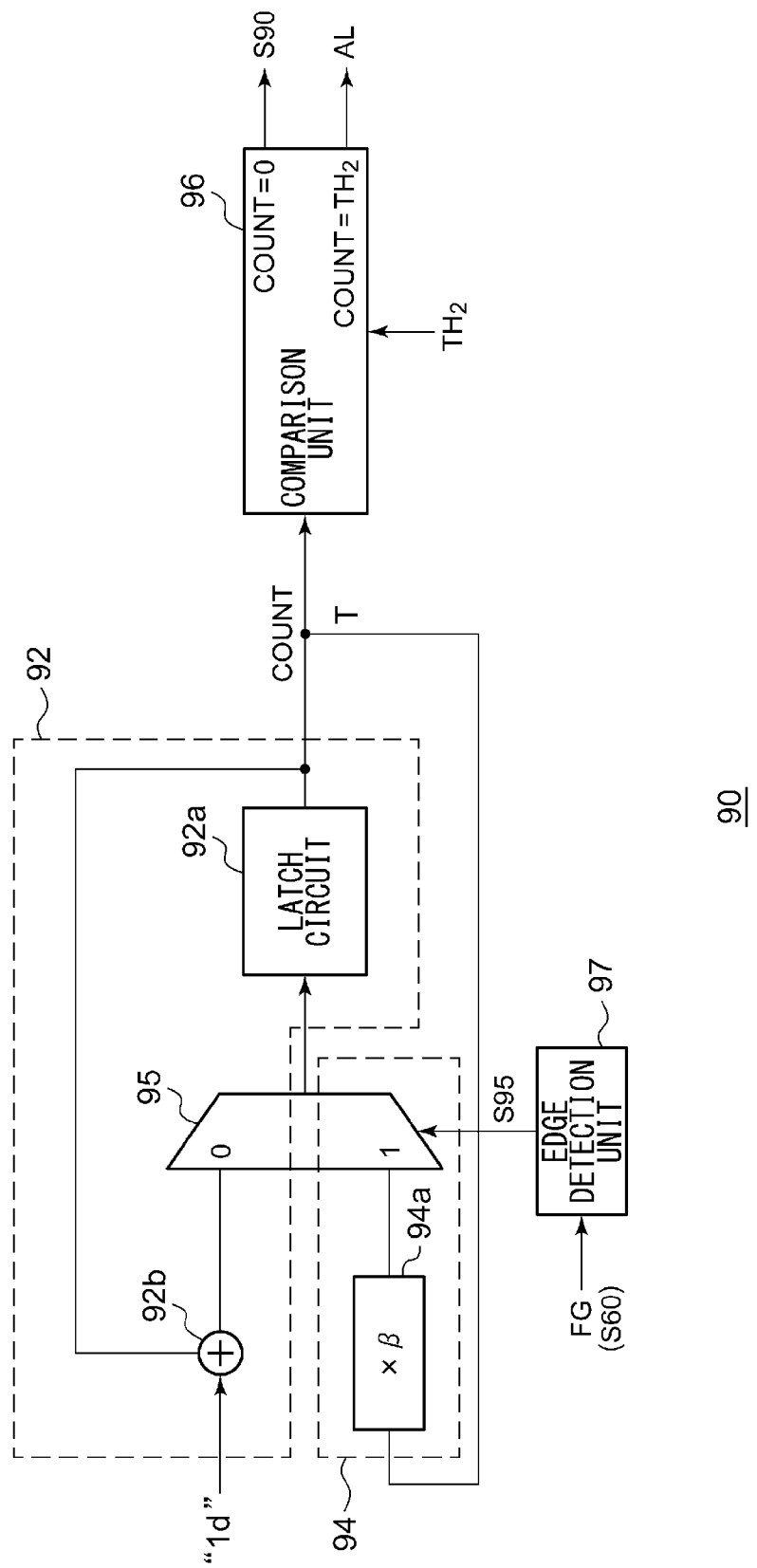
FIG. 13 is a circuit diagram which shows a configuration of a timing detection circuit.

FIG. 13 is a circuit diagram which shows a configuration of the timing control circuit 90. The configuration of the aforementioned timing detection circuit 90 requires a latch circuit (memory), leading to a problem of an increased circuit scale.

The timing detection circuit 90 receives a signal that corresponds to the Hall signal H+ and H− from the Hall sensor 8, and generates a timing signal S90 which is asserted at a predetermined timing in every cycle of the Hall signal H+ and H−. Examples of the aforementioned timing include: a timing at which the Hall signal H+ becomes a value in the vicinity of the peak; a timing at which the Hall signal H+ becomes a value in the vicinity of the bottom. Also, another timing may be employed.

The timing detection circuit 90 includes a counter 92, a reset unit 94, and a comparison unit 96.

The timing detection circuit 90 performs an operation in synchronization with the clock signal CLK. The counter 92 is configured as a timer configured to perform a counting operation according to the clock signal CLK. With such an arrangement, the counter 92 counts up in predetermined increments for every cycle of the clock signal CLK. FIG. 13 shows an arrangement in which the increment value is the decimal number 1.

The counter 92 includes a latch circuit 92a, an adder 92b, and a selector 95. The latch circuit 92a holds the input value. The adder 92b sums the output data of the latch circuit 92a and the increment value "1d". The output data of the adder 92b is input to the latch circuit 92a via the selector 95. By means of such a loop including the latch circuit 92a, the adder 92b, and the selector 95, the count value COUNT is counted up in predetermined increments for every clock signal CLK.

For every cycle of the Hall signal H+ and H−, the reset unit 94 resets the count value COUNT of the counter 92 to a value obtained by multiplying the count value COUNT immediately before the reset operation by a negative coefficient $\beta$. For example, the reset unit 94 includes a calculation unit 94a and the selector 95. The calculation unit 94a multiplies the count value COUNT of the counter 92 by the negative coefficient $\beta$. The selector 95 receives a control signal S95 which is asserted for every cycle of the Hall signal H+ and H−. An edge detection unit 97 asserts the control signal S95 for every edge of the FG signal (S60).

The negative coefficient $\beta$ should be determined according to a predetermined timing. For example, in a case in which there is a desire to assert the timing signal at a timing that is at ⅓ the period of the Hall signal, $\beta$ should be set to −½. The calculation for multiplying input data by ½ can be provided by a bit shifter. Thus, such an arrangement does not require a so-called calculation circuit. In a case in which there is a desire to assert the timing signal at a timing that is at half the period of the Hall signal, $\beta$ should be set to −1. In general, such an arrangement detects a timing that is obtained by dividing the period of the Hall signal by the ratio (−$\beta$):1. Also, the use of a so-called calculation unit improves the degree of freedom of selection of the coefficient $\beta$.

The selector 95 selects the output data of the calculation unit 94a, and outputs the selected data to the latch circuit 92a every time the control signal S95 is asserted, i.e., for every cycle of the Hall signal H+ and H−. As a result, the count value COUNT held by the latch circuit 92a is reset.

The comparison unit 96 asserts the timing signal S90 every time there is a zero-crossing in the count value COUNT of the counter 92.

Figure 14:
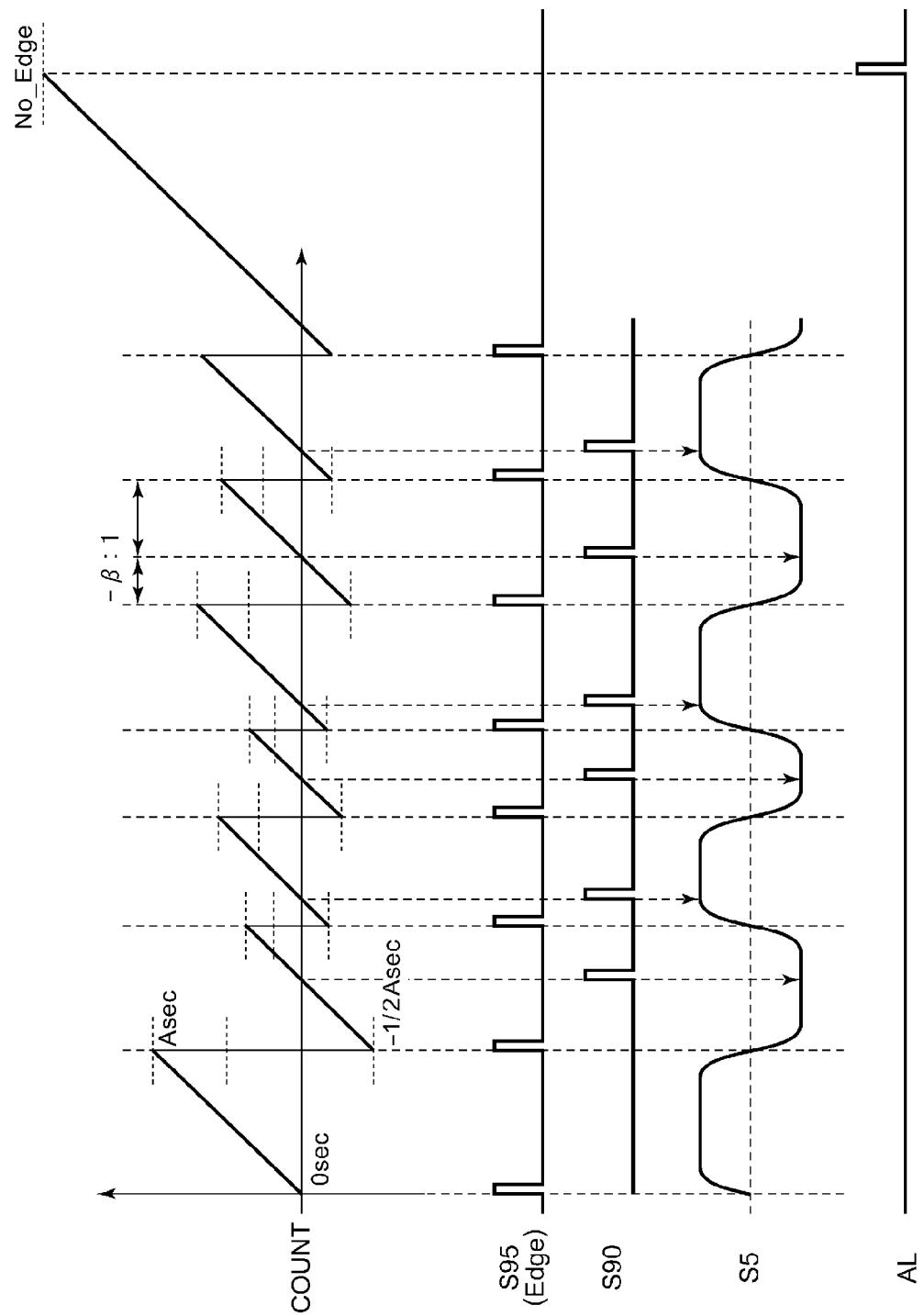
FIG. 14 is a circuit diagram which shows the operation of the timing detection circuit shown in FIG. 13.

The above is the configuration of the timing detection circuit 90. Next, description will be made regarding the operation thereof. FIG. 14 shows graphs each showing the operation of the timing detection circuit 90 shown in FIG. 13.

The counter 92 is reset to a value obtained by multiplying the count value COUNT immediately before the current cycle by the negative coefficient $\beta$, i.e., $\beta \times$COUNT, for every edge of the control signal S95. FIG. 13 shows a case in which the interval between edges greatly fluctuates, i.e., a case in which the period of the Hall signal H+ and H− greatly fluctuates, for convenience of description. However, in actuality, the change between the adjacent periods is not as great as that shown. Accordingly, there is a zero-crossing in the count value COUNT at a timing that divides the period of the Hall signal by the ratio −$\beta$:1 for every cycle.

For example, with an arrangement in which $\beta=-\frac{1}{2}$, such an arrangement suitably detects a timing of 33%. Such a timing is positioned in the vicinity of the peak and the bottom of the fifth signal S5 or a sixth signal S6 that corresponds to the fifth signal S5. Thus, such an arrangement is capable of generating a timing required for the offset correction circuit 16 and the amplitude correction circuit 20.

Furthermore, the timing detection circuit 90 may be used as the lock protection circuit 128 shown in FIG. 11. The lock protection circuit 128 is also referred to as a "watchdog timer", which is configured to detect if the fan motor to be driven has stopped due to abnormal operation.

With the timing detection circuit 90 shown in FIG. 13, if the rotation of the fan motor 5 has stopped, the FG signal S60 is stopped. Accordingly, the count value COUNT of the counter 92 is not reset, and the count value continuously increases. When the count value COUNT reaches a predetermined threshold value TH2, the comparison unit 96 asserts a detection signal (lock alarm signal) AL which indicates an abnormal state of the motor. The threshold value TH2 may be a setting value which can be set by the user. Also, the threshold value TH2 may be a fixed value held by the driving IC 100 itself.

The timing detection circuit 90 shown in FIG. 13 functions as both a watchdog timer (lock protection circuit 128) and the timing detection circuit 90, thereby providing a reduced circuit area. In other words, it can also be understood that the timing detection circuit 90 performs its operation using the counter included in the watchdog timer normally provided as a component of the driving IC. Thus, it can be said that there is almost no increase in the circuit area required to provide such a timing detection circuit 90.

Description has been made with reference to FIG. 13 regarding an arrangement in which the counter 92 is configured as an up counter. Also, the counter 92 may be configured as a down counter.

The use of the timing detection circuit 90 is not restricted to such detection of the peak and the bottom. Also, the timing detection circuit 90 may be applied to various kinds of timing detection.

Also, the target signal to be detected by the timing detection circuit 90 is not restricted to such a Hall signal H+ and H−. Also, the timing detection circuit 90 may be applied to various kinds of cyclic signals. For example, the timing detection circuit 90 may be employed in a sensorless motor driving circuit. Specifically, in some cases, there is a desire to set a time window or mask time in an operation for detecting the back electromotive force that occurs in a coil of the motor. The timing detection circuit shown in FIG. 13 is suitably applied to such an application.

Also, in some cases, there is a desire to switch the driving phase by monitoring the back electromotive force that occurs in a coil of a multi-phase motor, and by dividing the period of the back electromotive force. In this case, by setting the coefficient β that corresponds to the electrical angle at the timing detection circuit 90, such an arrangement is capable of generating such a switching timing.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention.

Description has been made in the embodiments regarding an arrangement in which the fan motor to be driven is configured as a single-phase driving motor. However, the present invention is not restricted to such an arrangement. Also, the present invention can be applied to the driving operation for other kinds of motors.

In the embodiments, all the components of the fan motor driving apparatus 100 may be monolithically integrated. Also, a part of the components of the fan motor driving apparatus 100 may be configured as a separate integrated circuit. Also, a part of the components thereof may be configured as a discrete component. Which components are to be integrated should be determined giving consideration to the cost, the area occupied, the usage, etc.

While the preferred embodiments of the present invention have been described using specific terms, such description is for illustrative purposes only, and it is to be understood that changes and variations may be made without departing from the spirit or scope of the appended claims.

What is claimed is:

1. A motor driving circuit configured to receive a Hall signal, which comprises a first signal and a second signal that are complementary, from a Hall sensor, and to drive a motor, the motor driving circuit comprising:
   a first A/D converter and a second A/D converter respectively configured to perform analog/digital conversion of the first signal and the second signal of the Hall signal so as to generate a third signal and a fourth signal in the form of digital signals;
   a differential conversion circuit configured to generate a fifth signal in the form of a single-ended signal that corresponds to the difference between the third signal and the fourth signal;
   an offset correction circuit configured to correct offset of the fifth signal so as to generate a sixth signal;
   an amplitude control circuit configured to stabilize the amplitude of the sixth signal to a predetermined target value, and to generate the absolute value of the resulting value, so as to generate a seventh signal;
   a control signal generating unit configured to generate a control signal based upon the seventh signal;
   a driver circuit configured to drive the motor according to the control signal; and
   a timing detection circuit configured to receive a signal that corresponds to the Hall signal output from the Hall sensor, and to generate a timing signal which is asserted at a predetermined timing in every cycle of the Hall signal, the timing detection circuit comprising:
      a counter configured to perform a counting operation according to a clock signal;
      a reset unit configured to reset a count value of the counter for every cycle of the counter, to a value obtained by multiplying the count value obtained immediately before the reset operation by a negative coefficient; and
      a comparison unit configured to assert the timing signal at every timing at which there is a zero-crossing in the value of the counter,
   wherein the amplitude control circuit sets the value of the seventh signal for the amplitude of the seventh signal at a timing at which the timing signal is asserted.

2. A motor driving circuit according to claim 1, wherein the negative coefficient is set to −½, and the predetermined timing is set at a timing that is ⅓ the period of the Hall signal.

3. A motor driving circuit configured to receive a Hall signal, which comprises a first signal and a second signal that are complementary, from a Hall sensor, and to drive a motor, the motor driving circuit comprising:
   a first A/D converter and a second A/D converter respectively configured to perform analog/digital conversion of the first signal and the second signal of the Hall signal so as to generate a third signal and a fourth signal in the form of digital signals;
   a differential conversion circuit configured to generate a fifth signal in the form of a single-ended signal that corresponds to the difference between the third signal and the fourth signal;
   an offset correction circuit configured to correct offset of the fifth signal so as to generate a sixth signal;
   an amplitude control circuit configured to stabilize the amplitude of the sixth signal to be a predetermined target value, and to generate the absolute value of the resulting value, so as to generate a seventh signal;
   a control signal generating unit configured to generate a control signal based upon the seventh signal;
   a driver circuit configured to drive the motor according to the control signal; and
   a timing detection circuit configured to receive a signal that corresponds to the Hall signal output from the Hall sensor, and to generate a timing signal which is asserted at a predetermined timing in every cycle of the Hall signal, the timing detection circuit comprising:
      a counter configured to perform a counting operation according to a clock signal;
      a reset unit configured to reset a count value of the counter for every cycle of the counter, to a value obtained by multiplying the count value obtained immediately before the reset operation by a negative coefficient and
      a comparison unit configured to assert the timing signal at every timing at which there is a zero-crossing in the value of the counter;
   wherein, when the value of the counter reaches a predetermined threshold value, the comparison unit asserts an abnormality detection signal which indicates an abnormal stoppage of a motor;
   wherein the amplitude control circuit sets the value of the seventh signal for the amplitude of the seventh signal at a timing at which the timing signal is asserted,
   and wherein, when the abnormality detection signal is asserted, the control signal generating unit stops the rotation of the motor.

4. A cooling apparatus comprising:
   a fan motor; and
   a driving circuit, configured to receive a Hall signal, which comprises a first signal and a second signal that are complementary, from a Hall sensor, and to drive a motor, the motor driving circuit comprising:
   a first A/D converter and a second A/D converter respectively configured to perform analog/digital conversion of the first signal and the second signal of the Hall signal so as to generate a third signal and a fourth signal in the form of digital signals;

a differential conversion circuit configured to generate a fifth signal in the form of a single-ended signal that corresponds to the difference between the third signal and the fourth signal;

an offset correction circuit configured to correct offset of the fifth signal so as to generate a sixth signal;

an amplitude control circuit configured to stabilize the amplitude of the sixth signal to a predetermined target value, and to generate the absolute value of the resulting value, so as to generate a seventh signal;

a control signal generating unit configured to generate a control signal based upon the seventh signal;

a driver circuit configured to drive the motor according to the control signal; and a timing detection circuit configured to receive a signal that corresponds to the Hall signal output from the Hall sensor, and to generate a timing signal which is asserted at a predetermined timing in every cycle of the Hall signal, the timing detection circuit comprising:
  a counter configured to perform a counting operation according to a clock signal;
  a reset unit configured to reset a count value of the counter for every cycle of the counter, to a value obtained by multiplying the count value obtained immediately before the reset operation by a negative coefficient; and
  a comparison unit configured to assert the timing signal at every timing at which there is a zero-crossing in the value of the counter wherein the amplitude control circuit sets the value of the seventh signal for the amplitude of the seventh signal at a timing at which the timing signal is asserted.

5. A cooling apparatus according to claim 4, wherein the negative coefficient is set to −½, and the predetermined timing is set at a timing that is ⅓ the period of the Hall signal.

6. A cooling apparatus comprising:

a fan motor; and a driving circuit configured to receive a Hall signal, which comprises a first signal and a second signal that are complementary, from a Hall sensor, and to drive a motor, the motor driving circuit comprising:

a first A/D converter and a second A/D converter respectively configured to perform analog/digital conversion of the first signal and the second signal of the Hall signal so as to generate a third signal and a fourth signal in the form of digital signals;

a differential conversion circuit configured to generate a fifth signal in the form of a single-ended signal that corresponds to the difference between the third signal and the fourth signal;

an offset correction circuit configured to correct offset of the fifth signal so as to generate a sixth signal;

an amplitude control circuit configured to stabilize the amplitude of the sixth signal to be a predetermined target value, and to generate the absolute value of the resulting value, so as to generate a seventh signal;

a control signal generating unit configured to generate a control signal based upon the seventh signal;

a driver circuit configured to drive the motor according to the control signal; and a timing detection circuit configured to receive a signal that corresponds to the Hall signal output from the Hall sensor, and to generate a timing signal which is asserted at a predetermined timing in every cycle of the Hall signal, the timing detection circuit comprising:
  a counter configured to perform a counting operation according to a clock signal;
  a reset unit configured to reset a count value of the counter for every cycle of the counter, to a value obtained by multiplying the count value obtained immediately before the reset operation by a negative coefficient; and
  a comparison unit configured to assert the timing signal at every timing at which there is a zero-crossing in the value of the counter;
  wherein, when the value of the counter reaches a predetermined threshold value, the comparison unit asserts an abnormality detection signal which indicates an abnormal stoppage of a motor;

wherein the amplitude control circuit sets the value of the seventh signal for the amplitude of the seventh signal at a timing at which the timing signal is asserted, and wherein, when the abnormality detection signal is asserted, the control signal generating unit stops the rotation of the motor.

7. An electronic device comprising:

a processor; and a cooling apparatus, configured to cool the processor, wherein the cooling apparatus comprises:

a fan motor; and a driving circuit configured to receive a Hall signal, which comprises a first signal and a second signal that are complementary, from a Hall sensor, and to drive a motor, the motor driving circuit comprising:

a first A/D converter and a second A/D converter respectively configured to perform analog/digital conversion of the first signal and the second signal of the Hall signal so as to generate a third signal and a fourth signal in the form of digital signals;

a differential conversion circuit configured to generate a fifth signal in the form of a single-ended signal that corresponds to the difference between the third signal and the fourth signal;

an offset correction circuit configured to correct offset of the fifth signal so as to generate a sixth signal;

an amplitude control circuit configured to stabilize the amplitude of the sixth signal to a predetermined target value, and to generate the absolute value of the resulting value, so as to generate a seventh signal;

a control signal generating unit configured to generate a control signal based upon the seventh signal;

a driver circuit configured to drive the motor according to the control signal; and a timing detection circuit configured to receive a signal that corresponds to the Hall signal output from the Hall sensor, and to generate a timing signal which is asserted at a predetermined timing in every cycle of the Hall signal, the timing detection circuit comprising:
  a counter configured to perform a counting operation according to a clock signal;
  a reset unit configured to reset a count value of the counter for every cycle of the counter, to a value obtained by multiplying the count value obtained immediately before the reset operation by a negative coefficient; and
  a comparison unit configured to assert the timing signal at every timing at which there is a zero-crossing in the value of the counter wherein the amplitude control circuit sets the value of the seventh signal for the amplitude of the seventh signal at a timing at which the timing signal is asserted.

8. An electronic device according to claim 7, wherein the negative coefficient is set to $-\frac{1}{2}$, and the predetermined timing is set at a timing that is $\frac{1}{3}$ the period of the Hall signal.

9. An electronic device comprising:
   a processor; and
   a cooling apparatus, configured to cool the processor, wherein the cooling apparatus comprises:
a fan motor; and
   a driving circuit configured to receive a Hall signal, which comprises a first signal and a second signal that are complementary, from a Hall sensor, and to drive a motor, the motor driving circuit comprising:
   a first A/D converter and a second A/D converter respectively configured to perform analog/digital conversion of the first signal and the second signal of the Hall signal so as to generate a third signal and a fourth signal in the form of digital signals;
   a differential conversion circuit configured to generate a fifth signal in the form of a single-ended signal that corresponds to the difference between the third signal and the fourth signal;
   an offset correction circuit configured to correct offset of the fifth signal so as to generate a sixth signal;
   an amplitude control circuit configured to stabilize the amplitude of the sixth signal to be a predetermined target value, and to generate the absolute value of the resulting value, so as to generate a seventh signal;
   a control signal generating unit configured to generate a control signal based upon the seventh signal;
   a driver circuit configured to drive the motor according to the control signal; and
   a timing detection circuit configured to receive a signal that corresponds to the Hall signal output from the Hall sensor, and to generate a timing signal which is asserted at a predetermined timing in every cycle of the Hall signal, the timing detection circuit comprising:
   a counter configured to perform a counting operation according to a clock signal;
   a reset unit configured to reset a count value of the counter for every cycle of the counter, to a value obtained by multiplying the count value obtained immediately before the reset operation by a negative coefficient; and
   a comparison unit configured to assert the timing signal at every timing at which there is a zero-crossing in the value of the counter;
   wherein, when the value of the counter reaches a predetermined threshold value, the comparison unit asserts an abnormality detection signal which indicates an abnormal stoppage of a motor;
wherein the amplitude control circuit sets the value of the seventh signal for the amplitude of the seventh signal at a timing at which the timing signal is asserted,
and wherein, when the abnormality detection signal is asserted, the control signal generating unit stops the rotation of the motor.

* * * * *